United States Patent
Jang et al.

(10) Patent No.: US 12,557,455 B2
(45) Date of Patent: Feb. 17, 2026

(54) LIGHT EMITTING DEVICE HAVING A STACKED STRUCTURE

(71) Applicant: Seoul Viosys Co., Ltd., Ansan-si (KR)

(72) Inventors: Jong Min Jang, Ansan-si (KR); Chang Yeon Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 27 days.

(21) Appl. No.: 18/763,447

(22) Filed: Jul. 3, 2024

(65) Prior Publication Data

US 2024/0355991 A1 Oct. 24, 2024

Related U.S. Application Data

(63) Continuation of application No. 18/132,938, filed on Apr. 10, 2023, now Pat. No. 12,057,542, which is a
(Continued)

(51) Int. Cl.
*H10H 20/857* (2025.01)
*H10H 20/821* (2025.01)
(Continued)

(52) U.S. Cl.
CPC ........ *H10H 20/857* (2025.01); *H10H 20/821* (2025.01); *H10H 20/851* (2025.01); *H10H 29/10* (2025.01)

(58) Field of Classification Search
CPC ... H10H 20/857; H10H 20/821; H10H 20/851
(Continued)

(56) References Cited

U.S. PATENT DOCUMENTS 9,130,353 B2  9/2015  Lell et al.
9,923,032 B2  3/2018  Lee et al.
(Continued)

FOREIGN PATENT DOCUMENTS

DE   102016104280   9/2017
JP   2007-057667    3/2007
(Continued)

OTHER PUBLICATIONS

Notice of Allowance issued Apr. 4, 2024, in U.S. Appl. No. 18/132,938.
(Continued)

*Primary Examiner* — Xia L Cross
(74) *Attorney, Agent, or Firm* — Oblon, McClelland, Maier & Neustadt, L.L.P.

(57) ABSTRACT

A light emitting device including a first light emitting part, a second light emitting part disposed on a first surface of the first light emitting part, and a third light emitting part disposed on a first surface of the second light emitting part, a first contact member contacting a surface of a second n-type semiconductor layer of the second light emitting part, an ohmic electrode electrically connected to a third p-type semiconductor layer of the third light emitting part, and an adhesive layer disposed between the second light emitting part and the third light emitting part, in which the first contact member extends toward the first light emitting part to be electrically connected to a first n-type semiconductor layer of the first light emitting part, and the adhesive layer extends toward the ohmic electrode.

20 Claims, 21 Drawing Sheets

Related U.S. Application Data continuation of application No. 17/895,067, filed on Aug. 25, 2022, now Pat. No. 11,626,554, which is a continuation of application No. 16/561,256, filed on Sep. 5, 2019, now Pat. No. 11,430,929.

(60) Provisional application No. 62/731,206, filed on Sep. 14, 2018.

(51) Int. Cl.
*H10H 20/851* (2025.01)
*H10H 29/10* (2025.01)

(58) Field of Classification Search
USPC .......................................................... 257/88
See application file for complete search history.

(56) References Cited

U.S. PATENT DOCUMENTS

| | | | |
|---|---|---|---|
| 10,084,020 | B2 | 9/2018 | Kang et al. |
| 10,210,795 | B2 | 2/2019 | Kim et al. |
| 10,686,099 | B2 | 6/2020 | Huppmann et al. |
| 2009/0078955 | A1 | 3/2009 | Fan et al. |
| 2011/0204376 | A1* | 8/2011 | Su ................... H01L 25/0756 438/46 |
| 2012/0091474 | A1 | 4/2012 | Or-Bach et al. |
| 2012/0287958 | A1 | 11/2012 | Lell et al. |
| 2015/0001561 | A1* | 1/2015 | Katsuno ............ H10H 20/8312 257/90 |
| 2017/0288088 | A1* | 10/2017 | Won Cheol ............ H10H 20/84 |
| 2017/0288093 | A1 | 10/2017 | Cha et al. |
| 2019/0258000 | A1 | 8/2019 | El-Ghoroury et al. |
| 2020/0287080 | A1 | 9/2020 | Kim |

FOREIGN PATENT DOCUMENTS

| | | |
|---|---|---|
| JP | 2015-012244 | 1/2015 |
| KR | 10-2017-0042426 | 4/2017 |
| KR | 10-2018-0060704 | 6/2018 |
| KR | 10-2018-0079814 | 7/2018 |
| WO | 2018/102311 | 6/2018 |

OTHER PUBLICATIONS

Office Action issued Dec. 8, 2023, in U.S. Appl. No. 18/132,938.
Korean Office Action issued Jun. 3, 2024, in Korean Patent Application No. 10-2021-7002552 therein 4 pages.
Notification of reasons for refusal on Japanese Patent Application No., 2021-512845 (with English Translation).
International Search Report on PCT/KR2019/011795 issued on Jan. 3, 2020.
Extended European Search Report dated May 23, 2022, issued to European Patent Application No. 19860130.4.
Non-Final Office Action dated Dec. 23, 2021, issued to U.S. Appl. No. 16/561,256.
Notice of Allowance dated Jul. 6, 2022, issued to U.S. Appl. No. 16/561,256.
Notice of Allowance dated Feb. 27, 2023, issued to U.S. Appl. No. 16/561,256.

* cited by examiner

LIGHT EMITTING DEVICE HAVING A STACKED STRUCTURE

CROSS-REFERENCE TO RELATED APPLICATIONS

This application is a Continuation of U.S. patent Ser. No. 18/132,938, filed Apr. 10, 2023, which is a Continuation of U.S. patent application Ser. No. 17/895,067, filed on Aug. 25, 2022, now issued as U.S. Pat. No. 11,626,554, which is a Continuation of U.S. patent application Ser. No. 16/561,256, filed on Sep. 5, 2019, now issued as U.S. Pat. No. 11,430,929, which claims the benefit of U.S. Provisional Patent Application No. 62/731,206, filed on Sep. 14, 2018, each of which is hereby incorporated by reference for all purposes as if fully set forth herein.

BACKGROUND

Field

Exemplary embodiments of the invention relate generally to a light emitting device, and more particularly, to a light emitting device in which a plurality of light emitting layers are stacked.

Discussion of the Background

Light emitting diodes, as inorganic light sources, are being diversely used in various fields, such as display devices, vehicle lamps, and general lighting. Light emitting diodes are rapidly replacing existing light sources due to their longer lifetime, lower power consumption, and quicker response speed than the existing light sources.

In particular, a display device generally displays various colors by utilizing mixed colors of blue, green, and red. Each pixel of a display device includes blue, green, and red sub pixels, and the color of a particular pixel is determined through the colors of these sub-pixels, and an image is implemented by a combination of pixels.

Light emitting diodes have been mainly used as backlight sources in display devices. However, recently, a micro LED display has been developed as a next generation display, which directly implements images by using light emitting diodes.

The above information disclosed in this Background section is only for understanding of the background of the inventive concepts, and, therefore, it may contain information that does not constitute prior art.

SUMMARY

Light emitting devices constructed according to exemplary embodiments of the invention have excellent light reproducibility.

Additional features of the inventive concepts will be set forth in the description which follows, and in part will be apparent from the description, or may be learned by practice of the inventive concepts.

A light emitting device including a first light emitting part including a first n-type semiconductor layer, a first active layer, and a first p-type semiconductor layer, a second light emitting part disposed on a first surface of the first light emitting part, and including a second n-type semiconductor layer, a second active layer, and a second p-type semiconductor layer, the second n-type semiconductor layer having a first surface and a second surface opposing the first surface, a third light emitting part disposed on a first surface of the second light emitting part, and including a third n-type semiconductor layer, a third active layer, and a third p-type semiconductor layer, a first contact structure contacting the first surface of the second n-type semiconductor layer, and a second contact structure contacting the second surface of the second n-type semiconductor layer.

The first contact structure may extend into the first light emitting part to electrically contact the first n-type semiconductor layer, and the second contact structure may extend into the second light emitting part to electrically contact the third n-type semiconductor layer.

The light emitting device may further include a third contact structure extending into the third light emitting part to electrically contact the third n-type semiconductor layer.

The light emitting device may further include a common pad disposed at a first corner of the light emitting device, and electrically coupled with the first, second, and third n-type semiconductor layers, a first pad disposed at a second corner of the light emitting device, and electrically coupled with the first p-type semiconductor layer, a second pad disposed at a third corner of the light emitting device, and electrically coupled with the second p-type semiconductor layer, and a third pad disposed at a fourth corner of the light emitting device, and electrically coupled with the third p-type semiconductor layer, in which the first, second, and third n-type semiconductor layers are electrically coupled with one another by the first to third contact structures.

The second light emitting part may have a mesa structure, such that a portion thereof in the second corner is removed, and the third light emitting part may have a mesa structure, such that portions thereof in the second and third corners are removed.

The light emitting device may further include a first color filter surrounding an outer sidewall of the first contact structure, and extending onto the first p-type semiconductor layer, a first adhesion layer surrounding an outer sidewall of the first color filter, and extending onto the first color filter, a second color filter surrounding an outer sidewall of the second contact structure, and extending onto the second p-type semiconductor layer, and a second adhesion layer surrounding an outer sidewall of the second color filter, and extending onto the second color filter.

The first contact structure may extend into the second light emitting part, and the second contact structure may extend into the third light emitting part and is electrically coupled with the third n-type semiconductor layer.

One surface of the first contact structure may electrically contact the second n-type semiconductor layer, and the other surface of the first contact structure may electrically contact the first n-type semiconductor layer.

The light emitting device may further include a common pad disposed at a first corner of the light emitting device, and electrically coupled with the first, second, third n-type semiconductor layers, a first pad disposed at a second corner of the light emitting device, and electrically coupled with the first p-type semiconductor layer, a second pad disposed at a third corner of the light emitting device, and electrically coupled with the second p-type semiconductor layer, and a third pad disposed at a fourth corner of the light emitting device, and electrically coupled with the third p-type semiconductor layer, in which the first, second, third n-type semiconductor layers are electrically coupled with one another by the first and second contact structures.

The first light emitting part may have a mesa structure, such that the first n-type semiconductor layer and the second active layer are not formed in at least a portion of the second corner, the second light emitting part may have a mesa structure, such that portions thereof in the second and third corners are removed, and the third light emitting part has a mesa structure, such that a portion thereof in e fourth corner is removed.

The light emitting device may further include a first color filter surrounding an outer sidewall of the first contact structure, and extending onto the second p-type semiconductor layer, a first adhesion layer surrounding an outer sidewall of the first color filter, and extending onto the first color filter, a second color filter surrounding an outer sidewall of the second contact structure, and extending onto the third p-type semiconductor layer, and a second adhesion layer surrounding an outer sidewall of the second color filter, and extending onto the second color filter.

The light emitting device may further include a third contact structure extending into the first light emitting part and electrically contacting the first n-type semiconductor layer.

The first contact structure and the third contact structure may be in electrical contact with each other.

Each of the first, second, and third contact structures may include an ohmic layer, a first conductive layer, a barrier layer, a second conductive layer, and a bonding layer, and the bonding layer of the first contact structure and the bonding layer of the third contact structure may contact each other.

The light emitting device may further include a common pad disposed at a first corner of the light emitting device, and electrically coupled with the first, second, and third n-type semiconductor layers, a first pad disposed at a second corner of the light emitting device, and electrically coupled with the first p-type semiconductor layer, a second pad disposed at a third corner of the light emitting device, and electrically coupled with the second p-type semiconductor layer, and a third pad disposed at a fourth corner of the light emitting device, and electrically coupled with the third p-type semiconductor layer, in which the first, second, and third n-type semiconductor layers may be electrically coupled with one another by the first, second, and third contact structures.

The second light emitting part may have a mesa structure, such that portions thereof in the second and third corners are removed, and the third light emitting part may have a mesa structure, such that a portion thereof in the fourth corner is removed.

The light emitting device may further include a first color filter surrounding an outer sidewall of the third contact structure, and extending onto the first p-type semiconductor layer, a first adhesion layer surrounding an outer sidewall of the first color filter, and extending onto the first color filter, a second color filter surrounding an outer sidewall of the second contact structure, and extending onto the third p-type semiconductor layer, and a second adhesion layer surrounding an outer sidewall of the second color filter, and extending onto the second color filter.

The light emitting device may further include a substrate disposed over a second surface of the first light emitting part opposing the first surface thereof.

The light emitting device may further include a common pad disposed on the third light emitting part, and electrically coupling the first, second, and third n-type semiconductor layers, a first pad disposed on the third light emitting part, and electrically coupled with the first p-type semiconductor layer, a second pad disposed on the third light emitting part, and electrically coupled with the second p-type semicon-ductor layer, and a third pad disposed on the third light emitting part, and electrically coupled with the third p-type semiconductor layer.

The light emitting device may further include a support substrate disposed on the third light emitting part, and including through electrodes electrically coupled with the common pad, the first pad, the second pad, and the third pad, respectively It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
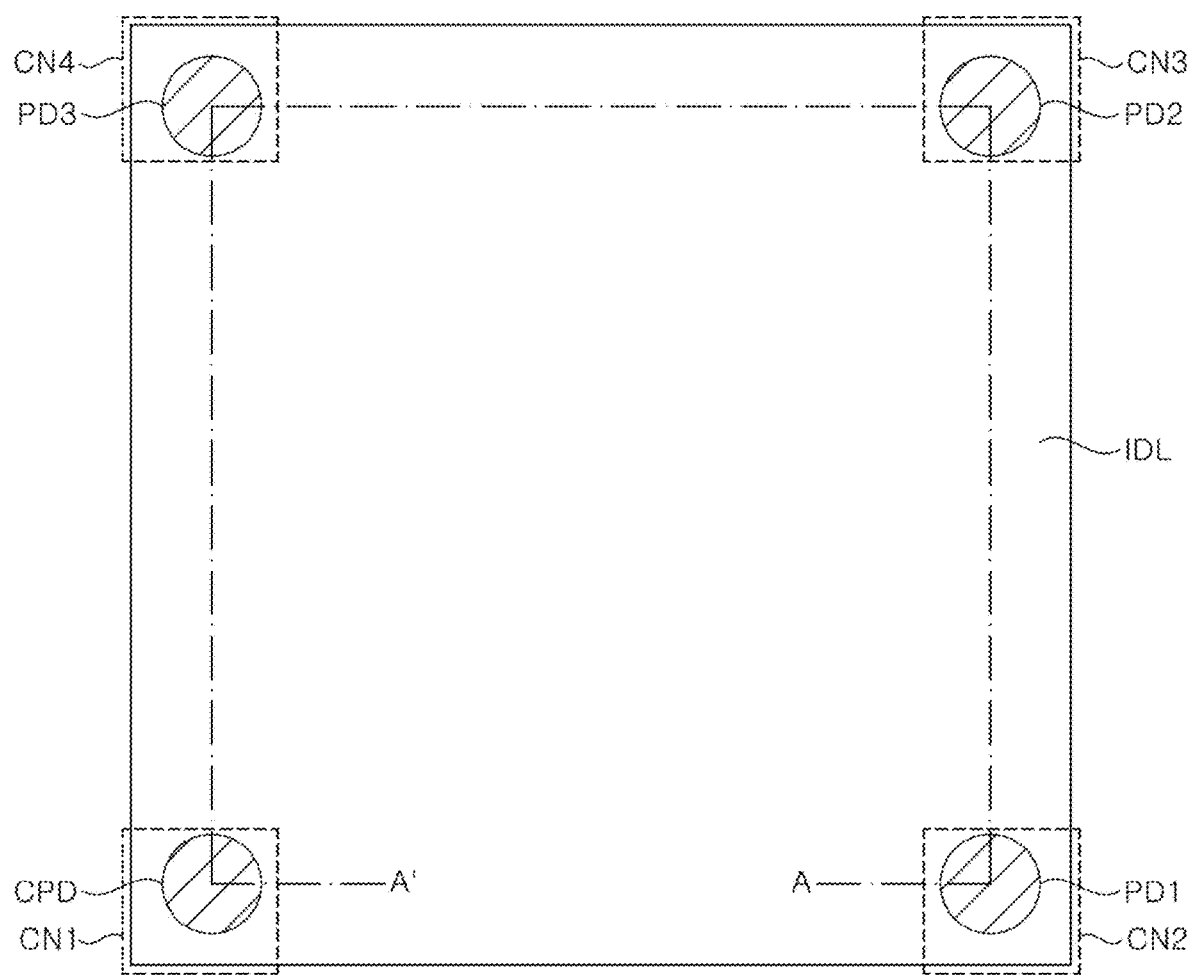
FIG. 1A is a top view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
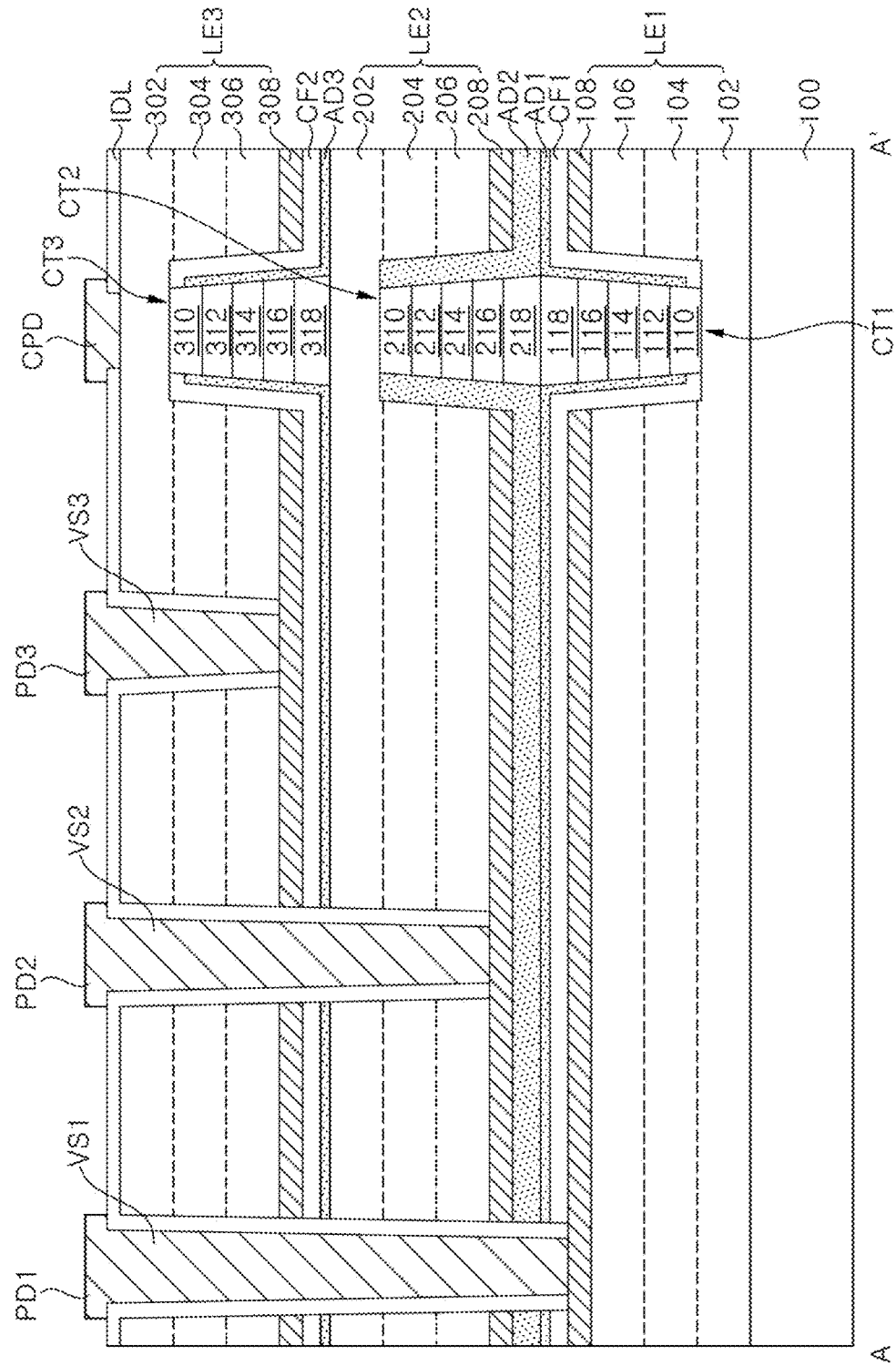
FIGS. 1B, 1C, and 1D are cross-sectional views taken along line A-A' of FIG. 1A according to exemplary embodiments.
Figure 1C:
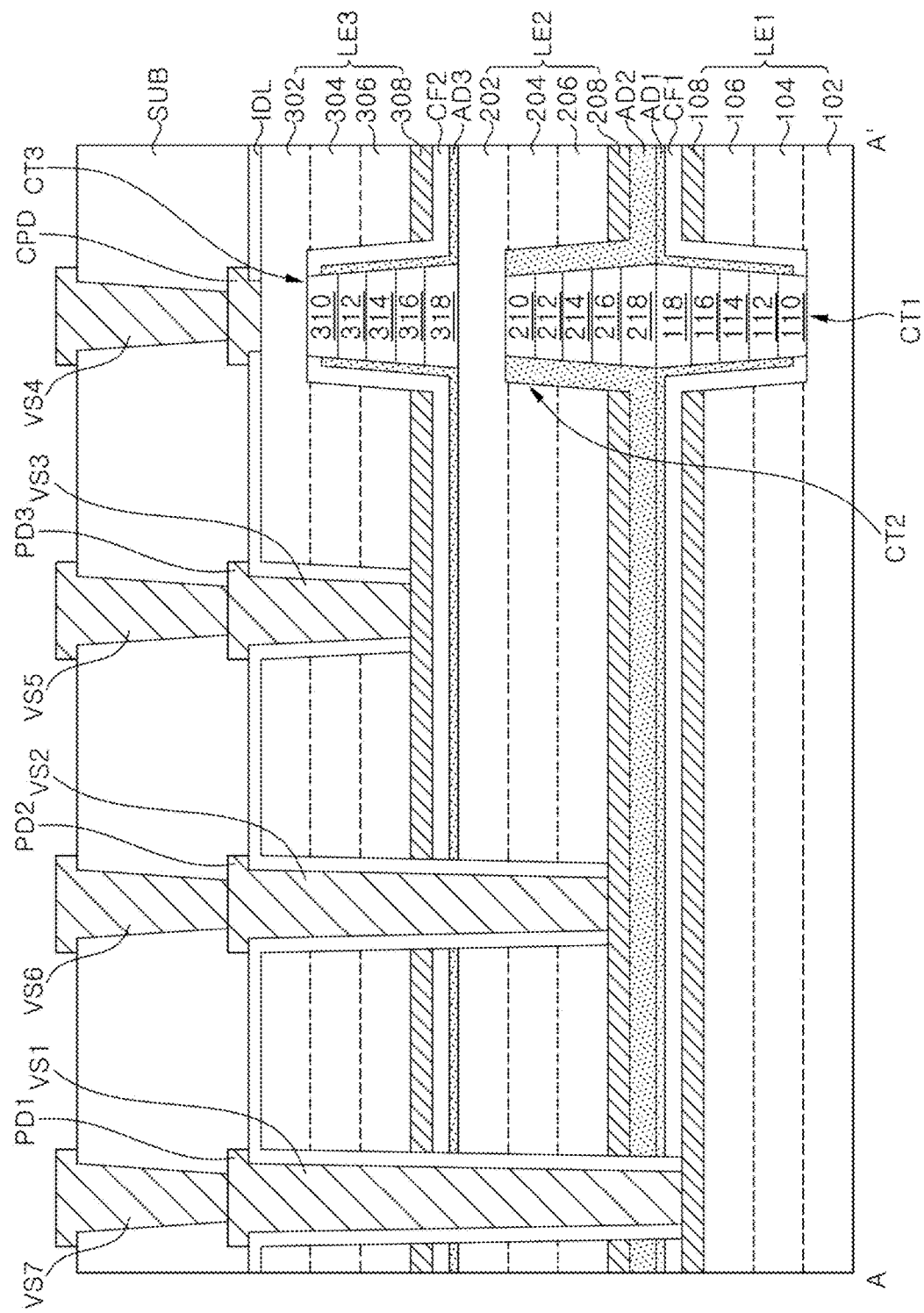

FIG. 1A is a top view of a light emitting device according to an exemplary embodiment, and FIGS. 1B and 1C are cross-sectional views taken along line A-A' of FIG. 1A according to exemplary embodiments.

Referring to FIGS. 1A to 1C, a light emitting device may include a first light emitting part LE1, a second light emitting part LE2, and a third light emitting part LE3, which are vertically stacked on a substrate 100.

The substrate 100 may be capable of growing a gallium nitride-based semiconductor layer thereon, and may include a sapphire ($Al_2O_3$), a silicon carbide (SiC), a gallium nitride (GaN), an indium gallium nitride (InGaN), an aluminum gallium nitride (AlGaN), an aluminum nitride (AlN), a gallium oxide ($Ga_2O_3$), or silicon. Also, the substrate 100 may be a patterned sapphire substrate.

One surface of the substrate 100 may be brought into contact with the first light emitting part LE1, and the other, opposing surface may be the light extraction surface of the light emitting device. In some exemplary embodiments, the substrate 100 may be removed. In this case, one surface of the first light emitting part LE1 facing the substrate 100 may be the light extraction surface of the light emitting device. When the light extraction surface is the other surface of the substrate 100 or the one surface of the first light emitting part LE1, the wavelength of light emitted from the first light emitting part LE1 may be the shortest, the wavelength of light emitted from the second light emitting part LE2 may be longer than the wavelength of light emitted from the first light emitting part LE1 and shorter than the wavelength of light emitted from the third light emitting part LE3, and the wavelength of light emitted from the third light emitting part LE3 may be the longest. For example, the first light emitting part LE1 may emit blue light, the second light emitting part LE2 may emit green light, and the third light emitting part LE3 may emit red light.

The first light emitting part LE1 may include a first n-type semiconductor layer 102, a first active layer 104, a first p-type semiconductor layer 106, and a first transparent electrode 108. The second light emitting part LE2 may include a second n-type semiconductor layer 202, a second active layer 204, a second p-type semiconductor layer 206, and a second transparent electrode 208. The third light emitting part LE3 may include a third n-type semiconductor layer 302, a third active layer 304, a third p-type semiconductor layer 306, and a third transparent electrode 308.

Each of the first n-type semiconductor layer 102, the second n-type semiconductor layer 202, and the third n-type semiconductor layer 302 may be a Si-doped gallium nitride-based semiconductor layer. Each of the first p-type semiconductor layer 106, the second p-type semiconductor layer 206, and the third p-type semiconductor layer 306 may be a Mg-doped gallium nitride-based semiconductor layer. Each of the first active layer 104, the second active layer 204, and the third active layer 304 may include a multi-quantum well (MQW), and the composition ratio thereof may be determined to emit light of a desired peak wavelength. As each of the first transparent electrode 108, the second transparent electrode 208 and the third transparent electrode 308, a transparent conductive oxide (TCO), such as ZnO, indium tin oxide (ITO), zinc-doped indium tin oxide (ZITO), zinc indium oxide (ZIO), gallium indium oxide (GIO), zinc tin oxide (ZTO), fluorine-doped tin oxide (FTO), gallium-doped zinc oxide (GZO), aluminum-doped zinc oxide (AZO) may be used.

The light emitting device may further include a first contact structure CT1, which extends through a portion of the first light emitting part LE1, a second contact structure CT2, which extends through a portion of the second light emitting part LE2, and a third contact structure CT3, which extends through a portion of the third light emitting part LE3.

The first contact structure CT1, the second contact structure CT2, and the third contact structure CT3 may include ohmic layers 110, 210, and 310, first conductive layers 112, 212, and 312, barrier layers 114, 214, and 314, second conductive layers 116, 216, and 316, and bonding layers 118, 218, and 318, respectively. At least one of the ohmic layer 110, 210, and 310 may include Cr, at least one of the first conductive layer 112, 214, and 314 may include Al, at least one of the barrier layer 114, 214, and 314 may include Ti and Ni, which are stacked a plurality of times, at least one of the second conductive layer 116, 216, and 316 may include Au, and at least one of the bonding layer 118, 218, and 318 may include In or Sn.

According to an exemplary embodiment, the first contact structure CT1, the second contact structure CT2, and the third contact structure CT3 may be disposed to overlap one another. When the light emitting device has a substantially quadrangular structure when viewed from the top, the first contact structure CT1, the second contact structure CT2, and the third contact structure CT3 may be sequentially disposed to overlap one another at a first corner CN1 of the light emitting device.

The light emitting device may further include a first color filter CF1, a first adhesion layer AD1, and a second adhesion layer AD2, which are disposed between the first light emitting part LE1 and the second light emitting part LE2, and a second color filter CF2 and a third adhesion layer AD3, which are disposed between the second light emitting part LE2 and the third light emitting part LE3.

Each of the first color filter CF1 and the second color filter CF2 may include a distributed Bragg reflector (DBR) having a structure, in which $TiO_2$ and $SiO_2$ are alternately stacked. However, the inventive concepts are not limited thereto, and in some exemplary embodiments, the color filters CF1 and CF2 may include other dielectric materials, such as $SiN_x$, $Al_2O_3$, $Ta_2O_5$ or the like. For example, the first color filter CF1 and the second color filter CF2 may be different in terms of the composition ratio and alternate stacking order and number of $TiO_2$ and $SiO_2$. According to an exemplary embodiment, the first color filter CF1 may selectively pass light generated from the second light emitting part LE2 and light generated from the third light emitting part LE3, and may reflect light generated from the first light emitting part LE1. The second color filter CF2 may selectively pass light generated from the third light emitting part LE3, and may reflect light generated from the first light emitting part LE1 and light generated from the second light emitting part LE2. The first color filter CF1 and the second color filter CF2 may function as insulation layers.

Each of the first adhesion layer AD1, the second adhesion layer AD2, and the third adhesion layer AD3 may include a material, which has an adhesion property and high transmittance, such as silicon on glass (SOG), epoxy, polyimide, SU8, benzo cyclo butane (BCB) or others.

In the first light emitting part LE1, the first n-type semiconductor layer 102, the first active layer 104, the first p-type semiconductor layer 106, and the first transparent electrode 108 may be sequentially stacked. The first light emitting part LE1 may have a first hole H1 (see FIG. 6), which passes through the first transparent electrode 108, the first p-type semiconductor layer 106, and the first active layer 104. The first hole H1 may have a constant width or a width that gradually decreases in a downward direction. As such, an area of the first transparent electrode 108 may be the same or less than an area of the first p-type semiconductor layer 106, and an area of the first p-type semiconductor layer 106 may be the same or less than an area of the first active layer 104.

The first hole H1 may partially expose the first n-type semiconductor layer 102. The first contact structure CT1 may be disposed in the first hole H1, and may have a structure which projects out of the first transparent electrode 108. More particularly, the top surface of the first contact structure CT1 may be disposed at a level higher than the top surface of the first transparent electrode 108. According to an exemplary embodiment, in the first contact structure CT1, the ohmic layer 110, the first conductive layer 112, the barrier layer 114, the second conductive layer 116, and the bonding layer 118 may be sequentially stacked.

The first adhesion layer AD1 may surround the outer sidewall of the first contact structure CT1 in the first hole H1, and extend onto the first transparent electrode 108. The first color filter CF1 may surround the outer sidewall of the first adhesion layer AD1 in the first hole H1, extend onto the first transparent electrode 108, and be disposed between the first transparent electrode 108 and the first adhesion layer AD1.

In the second light emitting part LE2, the second transparent electrode 208, the second p-type semiconductor layer 206, the second active layer 204, and the second n-type semiconductor layer 202 may be sequentially stacked. The second light emitting part LE2 may have a second hole H2 (see FIG. 11), which passes through the second transparent electrode 208, the second p-type semiconductor layer 206, and the second active layer 204. The second hole H2 may have a width that is constant or gradually increases in the downward direction. As such, the second active layer 204 may have a constant width or a width greater than the second p-type semiconductor layer 206, and the second p-type semiconductor layer 206 may have a constant width or a width greater than the second transparent electrode 208.

The second hole H2 may partially expose the second n-type semiconductor layer 202. The second contact structure CT2 may be disposed in the second hole H2, and may have a structure which projects out of the second transparent electrode 208. More particularly, the bottom surface of the second contact structure CT2 may be disposed at a level lower than the surface of the second transparent electrode 208. In the second contact structure CT2, the bonding layer 218, the second conductive layer 216, the barrier layer 214, the first conductive layer 212, and the ohmic layer 210 may be sequentially stacked.

The second adhesion layer AD2 may surround the outer sidewall of the second contact structure CT2, and extend onto the second transparent electrode 208.

While the first color filter CF1 is illustrated as being disposed between the first transparent electrode 108 and the first adhesion layer AD1, however, the inventive concepts are not limited thereto. For example, in some exemplary embodiments, the first color filter CF1 may be disposed between the second transparent electrode 208 and the second adhesion layer AD2.

According to an exemplary embodiment, as the first contact structure CT1 and the second contact structure CT2 are brought into electrical contact with each other, the first n-type semiconductor layer 102 and the second n-type semiconductor layer 202 may be electrically coupled with each other. The bonding layer 118 of the first contact structure CT1 and the bonding layer 218 of the second contact structure CT2 may be bonded with each other. With respect to the bonding surface of the first contact structure CT1 and the second contact structure CT2, the first contact structure CT1 and the second contact structure CT2 may have substantially symmetrical structure as each other. In particular, the bonding layer 118, the second conductive layer 116, the barrier layer 114, the first conductive layer 112, and the ohmic layer 110 may be disposed from the bonding surface in the first contact structure CT1, and the bonding layer 218, the second conductive layer 216, the barrier layer 214, the first conductive layer 212, and the ohmic layer 210 may be disposed from the bonding surface in the second contact structure CT2. In this manner, current applied to the second light emitting part LE2 and current applied to the first light emitting part LE1 may be uniform.

As the first adhesion layer AD1 and the second adhesion layer AD2 are bonded with each other, the first light emitting part LE1 and the second light emitting part LE2 may be physically bonded with each other.

In the third light emitting part LE3, the third transparent electrode 308, the third p-type semiconductor layer 306, the third active layer 304, and the third n-type semiconductor layer 302 may be sequentially stacked. The third light emitting part LE3 may have a third hole H3 (see FIG. 14), which passes through the third transparent electrode 308, the third p-type semiconductor layer 306, and the third active layer 304. The third hole H3 may have a width that gradually increases in the downward direction. As such, the third active layer 304 may have a width greater than the third p-type semiconductor layer 306, and the third p-type semiconductor layer 306 may have a width greater than the third transparent electrode 308.

The third hole H3 may partially expose the third n-type semiconductor layer 302. The third contact structure CT3 may be disposed in the third hole H3, and may have a structure which projects out of the third transparent electrode 308. More particularly, the bottom surface of the third contact structure CT3 may be disposed at a level lower than the surface of the third transparent electrode 308. In the third contact structure CT3, the bonding layer 318, the second conductive layer 316, the barrier layer 314, the first conductive layer 312, and the ohmic layer 310 may be sequentially stacked. According to an exemplary embodiment, since the first contact structure CT1, the second contact structure CT2, and the third contact structure CT3 have substantially the same structure, current transferred to the first n-type semiconductor layer 102, the second n-type semiconductor layer 202, and the third n-type semiconductor layer 302 may be uniform.

The third adhesion layer AD3 may surround the outer sidewall of the third contact structure CT3 in the third hole H3, and extend onto the third transparent electrode 308. The second color filter CF2 may surround the outer sidewall of the third adhesion layer AD3 in the third hole H3, extend onto the third transparent electrode 308, and be disposed between the third transparent electrode 308 and the third adhesion layer AD3.

As described above, according to an exemplary embodiment, as the first contact structure CT1 and the second contact structure CT2 are brought into electrical contact with each other, the first n-type semiconductor layer 102 and the second n-type semiconductor layer 202 may be electrically coupled with each other. The bonding layer of the first contact structure CT1 and the bonding layer of the second contact structure CT2 may be bonded to each other. Also, as the first adhesion layer AD1 and the second adhesion layer AD2 are bonded to each other, the first light emitting part LE1 and the second light emitting part LE2 may be physically bonded to each other.

Figure 1D:
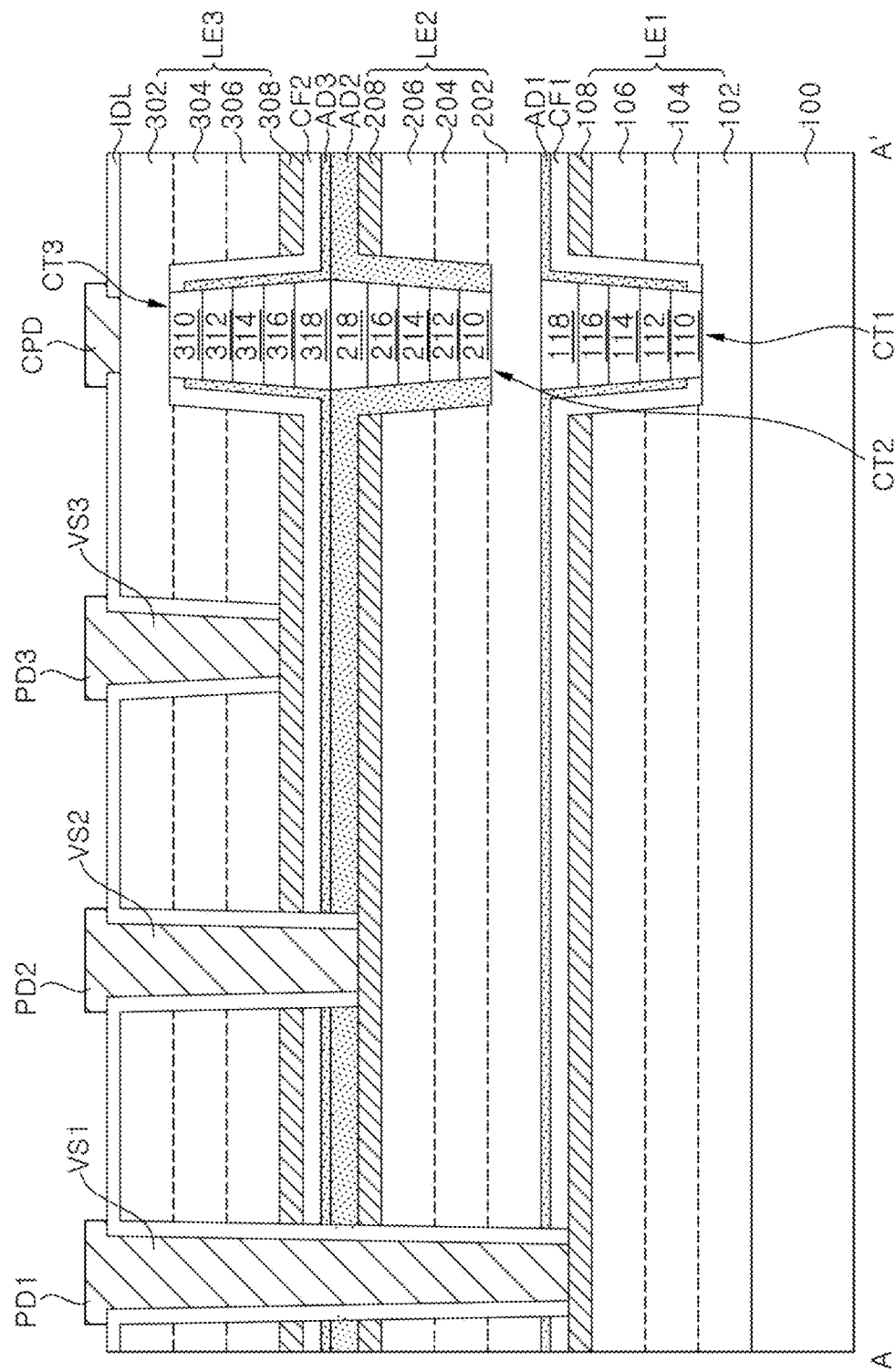

According to another exemplary embodiment, as shown in FIG. 1D, as the second contact structure CT2 and the third contact structure CT3 are brought into electrical contact with each other, the second n-type semiconductor layer 202 and the third n-type semiconductor layer 302 may be electrically coupled with each other. The bonding layer of the second contact structure CT2 and the bonding layer of the third contact structure CT3 may be bonded with each other. Also, as the second adhesion layer AD2 and the third adhesion layer AD3 are bonded with each other, the second light emitting part LE2 and the third light emitting part LE3 may be physically bonded with each other.

The light emitting device may further include a common pad CPD, which electrically couples the first n-type semiconductor layer 102, the second n-type semiconductor layer 202 and the third n-type semiconductor layer 302, a first pad PD1 electrically coupled with the first transparent electrode 108, a second pad PD2 electrically coupled with the second transparent electrode 208, and a third pad PD3 electrically coupled with the third transparent electrode 308. Each of the common pad CPD, the first pad PD1, the second pad PD2, and the third pad PD3 may include at least one selected from the group consisting of Ag, Ni, Al, Rh, Pd, Ir, Ru, Mg, Zn, Pt, Au, Hf, Cr, Ti, and Cu. The light emitting device may further include an insulation layer IDL for electrically insulating the common pad CPD, the first pad PD1, the second pad PD2, and the third pad PD3 from the third n-type semiconductor layer 302. The insulation layer IDL may include a silicon oxide or a silicon nitride, for example.

When the light emitting device has a substantially quadrangular structure when viewed from the top, the common pad CPD may be disposed at the first corner CN1, the first pad PD1 may be disposed at a second corner CN2, the second pad PD2 may be disposed at a third corner CN3, and the third pad PD3 may be disposed at a fourth corner CN4.

The common pad CPD may be electrically coupled in common with the first n-type semiconductor layer 102, the second n-type semiconductor layer 202, and the third n-type semiconductor layer 302 by the first contact structure CT1, the second contact structure CT2, and the third contact structure CT3. As the common pad CPD is coupled in common with the first n-type semiconductor layer 102, the second n-type semiconductor layer 202, and the third n-type semiconductor layer 302, it is possible to stably supply current. As described above, while each of the first p-type semiconductor layer 106, the second p-type semiconductor layer 206, and the third p-type semiconductor layer 306 includes a Mg-doped gallium nitride-based semiconductor layer, since the doping concentration of Mg is low, each of the first p-type semiconductor layer 106, the second p-type semiconductor layer 206, and the third p-type semiconductor layer 306 may have large contact resistance. As such, as compared to a case where the common pad CPD electrically couples in common the first p-type semiconductor layer 106, the second p-type semiconductor layer 206, and the third p-type semiconductor layer 306, by electrically coupling in common the first n-type semiconductor layer 102, the second n-type semiconductor layer 202, and the third n-type semiconductor layer 302, it is possible to stably supply current.

Referring to FIGS. 1A to 1C, the first pad PD1 disposed on the insulation layer EDL may be electrically coupled with the first transparent electrode 108 through a first via structure VS1, which passes through the third light emitting part LE3, the second color filter CF2, the third adhesion layer AD3, the second light emitting part LE2, the first adhesion layer AD1, and the first color filter CF1, and extends to the first transparent electrode 108. The insulation layer IDL may have a structure, which extends on the third n-type semiconductor layer 302 and surrounds the outer sidewall of the first via structure VS1. In some exemplary embodiments, the first pad PD1 and the first via structure VS1 may be integrated with each other.

The second pad PD2 disposed on the insulation layer IDL may be electrically coupled with the second transparent electrode 208 through a second via structure VS2, which passes through the third light emitting part LE3, the second color filter CF2, the third adhesion layer AD3, the second n-type semiconductor layer 202, the second active layer 204, and the second p-type semiconductor layer 206 and extends to the second transparent electrode 208. The insulation layer IDL may have a structure, which extends on the third n-type semiconductor layer 302 and surrounds the outer sidewall of the second via structure VS2. In some exemplary embodiments, the second pad PD2 and the second via structure VS2 may be integrated with each other.

The third pad PD3 disposed on the insulation layer IDL may be electrically coupled with the third transparent electrode 308 through a third via structure VS3, which passes through the third n-type semiconductor layer 302, the third active layer 304, and the third p-type semiconductor layer 306, and extends to the third transparent electrode 308. In some exemplary embodiments, the third pad PD3 and the third via structure VS3 may be integrated with each other.

Referring to FIG. 1C, the substrate 100 may be selectively removed. The light emitting device removed with the substrate 100 may be additionally provided with a support substrate SUB on the third light emitting part LE3. The support substrate SUB may suppress a phenomenon, in which the light emitting device removed with the substrate 100 is bended (or bows). The support substrate SUB may include Si.

In this case, the light emitting device may further include a seventh via structure VS7 electrically coupled with the first via structure VS1, a sixth via structure VS6 electrically coupled with the second via structure VS2, a fifth via structure VS5 electrically coupled with the third via structure VS3, and a fourth via structure VS4 electrically coupled with the common pad CPD.

Figure 2A:
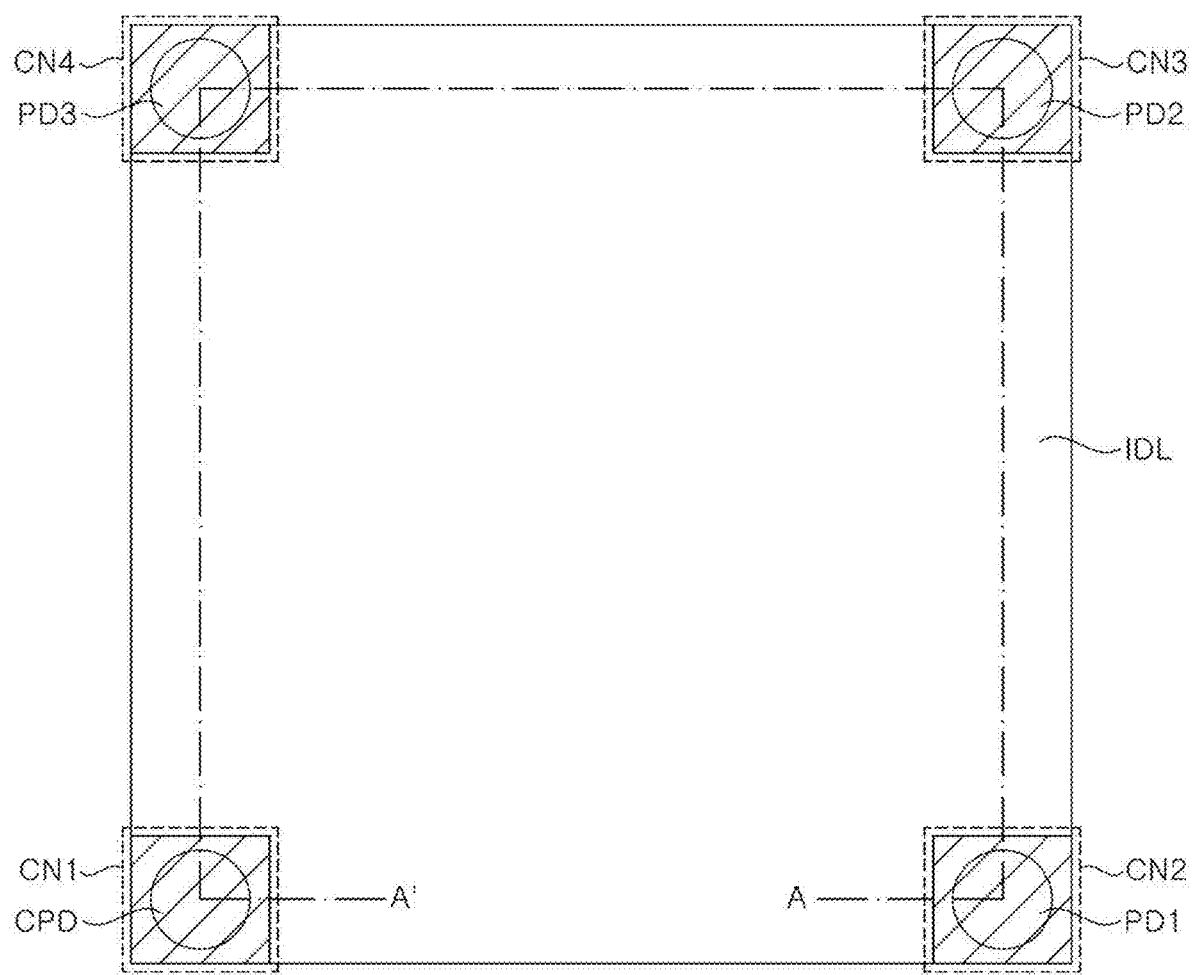
FIG. 2A is a top view of a light emitting device according to another exemplary embodiment.
Figure 2B:
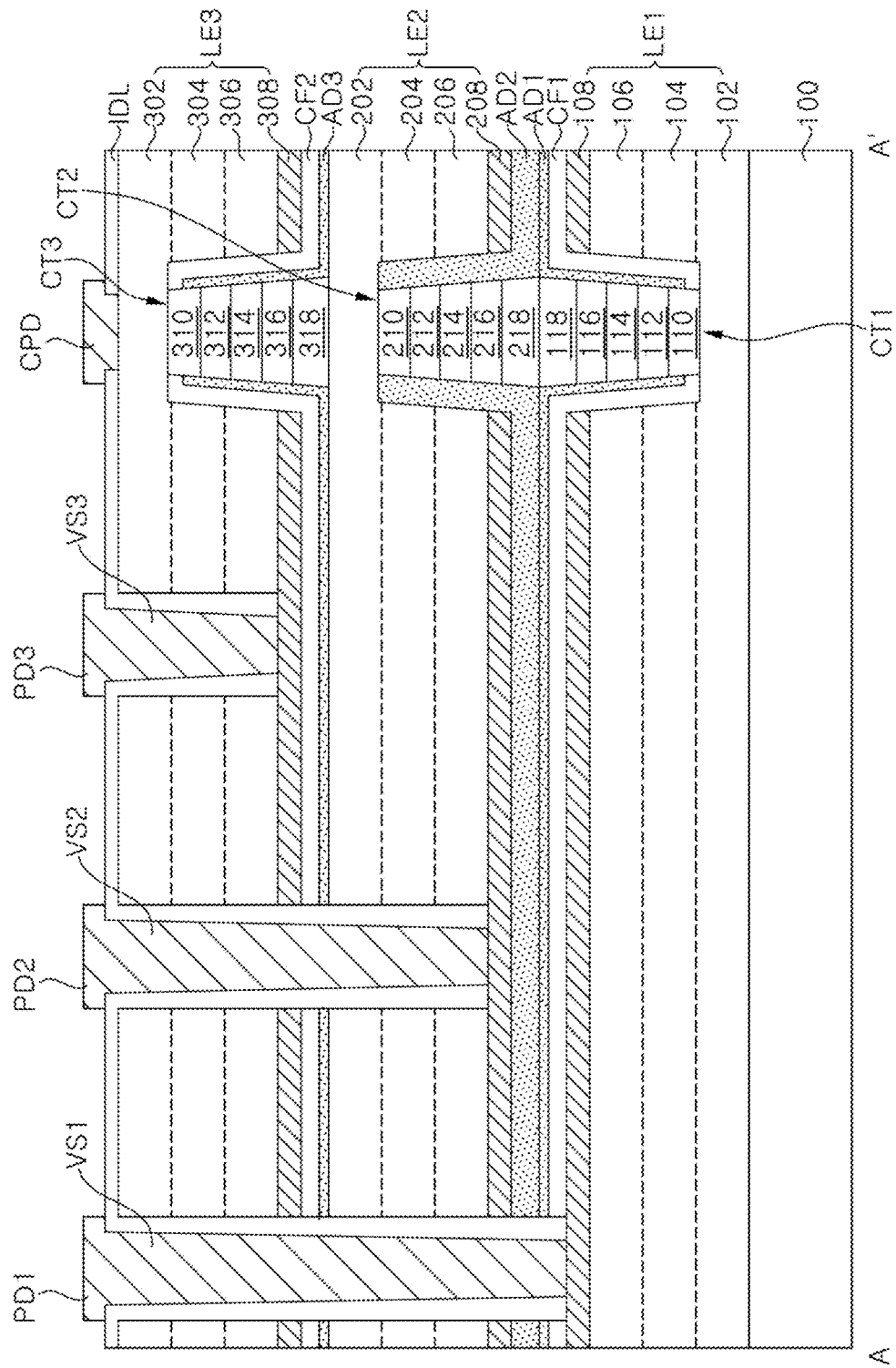
FIG. 2B is a cross-sectional view taken along line A-A' of FIG. 2A.

FIG. 2A is a top view of a light emitting device according to another exemplary embodiment, and FIG. 2B is a cross-sectional view taken along line A-A' of FIG. 2A.

Referring to FIGS. 2A and 2B, a light emitting device may include a first light emitting part LE1, a first color filter CF1, a first adhesion layer AD1, a second adhesion layer AD2, a second light emitting part LE2, a third adhesion layer AD3, a second color filter CF2, and a third light emitting part LE3.

In the first light emitting part LE1, a first n-type semiconductor layer 102, a first active layer 104, a first p-type semiconductor layer 106, and a first transparent electrode 108 may be sequentially stacked. In the second light emitting part LE2, a second transparent electrode 208, a second p-type semiconductor layer 206, a second active layer 204, and a second n-type semiconductor layer 202 may be sequentially stacked. In the third light emitting part LE3, a third transparent electrode 308, a third p-type semiconductor layer 306, a third active layer 304, and a third n-type semiconductor layer 302 may be sequentially stacked.

The light emitting device may include the first color filter CF1, the first adhesion layer AD1, and the second adhesion layer AD2, which are disposed between the first light emitting part LE1 and the second light emitting part LE2, and may include the second color filter CF2 and the third adhesion layer AD3, which are disposed between the second light emitting part LE2 and the third light emitting part LE3. The light emitting device may further include a common pad CPD, which is electrically coupled with the first n-type semiconductor layer 102, the second n-type semiconductor layer 202, and the third n-type semiconductor layer 302, a first pad PD1 electrically coupled with the first p-type semiconductor layer 106, a second pad PD2 electrically coupled with the second p-type semiconductor layer 206, and a third pad PD3 electrically coupled with the third p-type semiconductor layer 306.

According to the illustrated exemplary embodiment, each of the second light emitting part LE2 and the third light emitting part LE3 may have a mesa structure.

The light emitting device may have a substantially quadrangular structure when viewed from the top, and respective corners may be referred to as a first corner CN1, a second corner CN2, a third corner CN3, and a fourth corner CN4. The second light emitting part LE2 may have a mesa structure by removing a portion thereof disposed in the second corner CN2 and the third corner CN3, and the third light emitting part LE3 may have a mesa structure by removing a portion thereof disposed in the second corner CN2, the third corner CN3, and the fourth corner CN4.

In particular, the second light emitting part LE2 may have a structure, in which the second n-type semiconductor layer 202, the second active layer 204, the second n-type semiconductor layer 202, and the second transparent electrode 208 disposed at the second corner CN2 are etched, and the second p-type semiconductor layer 206, the second active layer 204, and the second n-type semiconductor layer 202 disposed at the third corner CN3 are etched. At the second corner CN2, as the second adhesion layer AD2, the first color filter CF1, and the first adhesion layer AD1 disposed at the second corner CN2 are etched, the first transparent electrode 108 of the first light emitting part LE1 may be exposed. At the third corner CN3, the second transparent electrode 208 of the second light emitting part LE2 may be exposed.

The third light emitting part LE3 may have a structure, in which the third n-type semiconductor layer 302, the third active layer 304, the third p-type semiconductor layer 306, and the third transparent electrode 308 disposed at the second corner CN2 and the third corner CN3 are etched, and the third n-type semiconductor layer 302, the third active layer 304, and the third p-type semiconductor layer 306 disposed at the fourth corner CN4 are etched. At the second corner CN2, as the third n-type semiconductor layer 302, the third active layer 304, the third p-type semiconductor layer 306, the third transparent electrode 308, the second color filter CF2, the third adhesion layer AD3, the second n-type semiconductor layer 202, the second active layer 204, the second p-type semiconductor layer 206, the second transparent electrode 208, the second adhesion layer AD2, the first adhesion layer AD1, and the first color filter CF1 disposed at the second corner CN2 are etched, the first transparent electrode 108 of the first light emitting part LE1 may be exposed. At the third corner CN3, as the third n-type semiconductor layer 302, the third active layer 304, the third p-type semiconductor layer 306, the third transparent electrode 308, the second color filter CF2, the third adhesion layer AD3, the second n-type semiconductor layer 202, the second active layer 204, and the second p-type semiconductor layer 206 disposed at the third corner CN3 are etched, the second transparent electrode 208 of the second light emitting part LE2 may be exposed. At the fourth corner CN4, as the third n-type semiconductor layer 302, the third active layer 304, and the third p-type semiconductor layer 306 are etched, the third transparent electrode 308 of the third light emitting part LE3 may be exposed.

The light emitting device may further include, in the second light emitting part LE2 and the third light emitting part LE3 having the mesa structures, a passivation layer PAL that fills the etched portions from forming the mesa structures. A first via structure VS1, a second via structure VS2, and a third via structure VS3 may be electrically coupled with the first transparent electrode 108, the second transparent electrode 208 and the third transparent electrode 308, respectively, through the passivation layer PAL.

In the illustrated exemplary embodiment, since the first light emitting part LE1, the second light emitting part LE2, the third light emitting part LE3, the first adhesion layer AD1, the second adhesion layer AD2, the third adhesion layer AD3, the first color filter CF1, the second color filter CF2, the common pad CPD, the first pad PD1, the second pad PD2, the third pad PD3, the first via structure VS1, the second via structure VS2, and the third via structure VS3 are substantially the same as those described above with reference to FIGS. 1A to 1C, repeated descriptions thereof will be omitted to avoid redundancy.

Figure 3:
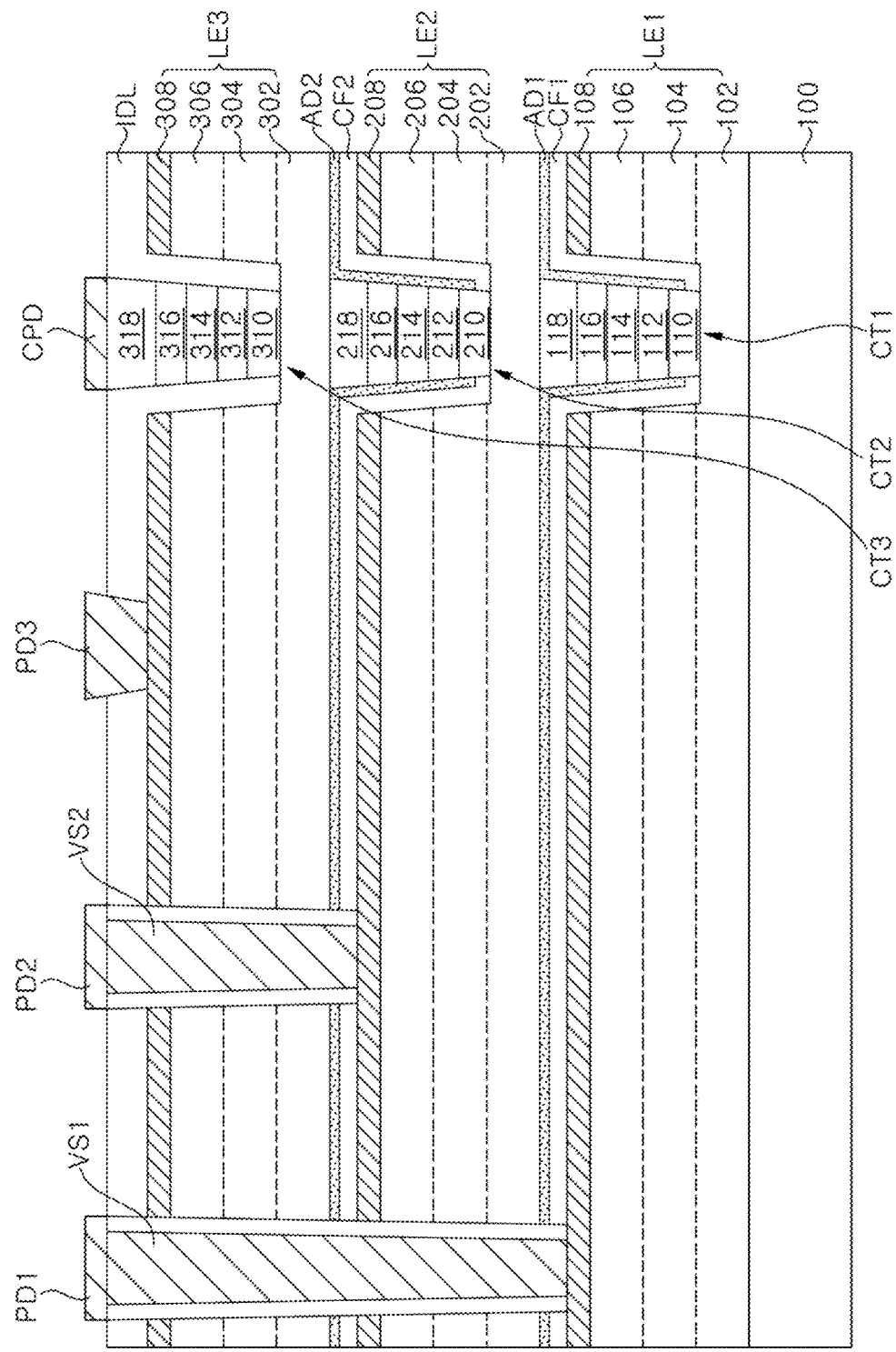
FIG. 3 is a cross-sectional view of a light emitting device according to still another exemplary embodiment.

FIG. 3 is a cross-sectional of a light emitting device according to still another exemplary embodiment.

Referring to FIG. 3, a light emitting device may include a first light emitting part LE1, a second light emitting part LE2, and a third light emitting part LE3, which are stacked on a substrate 100.

The first light emitting part LE1 may include a first n-type semiconductor layer 102, a first active layer 104, a first p-type semiconductor layer 106, and a first transparent electrode 108, which are sequentially stacked, the second light emitting part LE2 may include a second n-type semiconductor layer 202, a second active layer 204, a second p-type semiconductor layer 206, and a second transparent electrode 208, which are sequentially stacked, and the third light emitting part LE3 may include a third n-type semiconductor layer 302, a third active layer 304, a third p-type semiconductor layer 306, and a third transparent electrode 308, which are sequentially stacked.

The light emitting device may further include a common pad CPD, which is electrically coupled with the first n-type semiconductor layer 102, the second n-type semiconductor layer 202, and the third n-type semiconductor layer 302, a first pad PD1 electrically coupled with the first p-type semiconductor layer 106, a second pad PD2 electrically coupled with the second p-type semiconductor layer 206, and a third pad PD3 electrically coupled with the third p-type semiconductor layer 306.

The light emitting device may further include a first contact structure CT1 which extends through a portion of first light emitting part LE1, a second contact structure CT2 which extends through a portion of the second light emitting part LE2, and a third contact structure CT3 which extends through a portion of the third light emitting part LE3. One surface of the first contact structure CT1 may be brought into electrical contact with the first n-type semiconductor layer 102. The second n-type semiconductor layer 202 may be disposed between the other surface of the first contact structure CT1 facing away from the one surface and the second contact structure CT2, and be brought into electrical contact with the first contact structure CT1 and the second contact structure CT2. The third n-type semiconductor layer 302 may be disposed between the second contact structure CT2 and the third contact structure CT3, and be brought into electrical contact with the second contact structure CT2 and the third contact structure CT3.

In the first contact structure CT1, the second contact structure CT2, and the third contact structure CT3, ohmic layers 110, 210 and 310, first conductive layers 112, 212 and 312, barrier layers 114, 214 and 314, second conductive layers 116, 216, and 316, and bonding layers 118, 218, and 318 may be sequentially stacked. Each of the first contact structure CT1, the second contact structure CT2, and the third contact structure CT3 may have a width that gradually decreases in a downward direction.

The light emitting device may further include a first color filter CF1, which surrounds the outer sidewall of the first contact structure CT1 and extends onto the first transparent electrode 108, and a first adhesion layer AD1, which surrounds the outer sidewall of the first color filter CF1, extends onto the first transparent electrode 108, and bonds the first light emitting part LE1 and the second light emitting part LE2 to each other.

The light emitting device may further include a second color filter CF2, which surrounds the outer sidewall of the second contact structure CT2 and extends onto the second transparent electrode 208, and a second adhesion layer AD2, which surrounds the outer sidewall of the second color filter CF2, extends onto the second transparent electrode 208, and bonds the second light emitting part LE2 and the third light emitting part LE3 to each other.

The light emitting device may further include an insulation layer IDL, which surrounds the outer sidewall of the third contact structure CT3 and extends onto the third transparent electrode 308. The insulation layer IDL may include a silicon oxide or a silicon nitride, for example.

In the illustrated exemplary embodiment, since the first light emitting part LE1, the second light emitting part LE2, the third light emitting part LE3, the first adhesion layer AD1, the second adhesion layer AD2, a third adhesion layer AD3, the first color filter CF1, the second color filter CF2, the insulation layer IDL, the common pad CPD, the first pad PD1, the second pad PD2, the third pad PD3, the first via structure VS1, and the second via structure VS2 are substantially the same as those described above with reference to FIGS. 1A to 1C, 2A and 2B, repeated descriptions thereof will be omitted herein.

Figure 4:
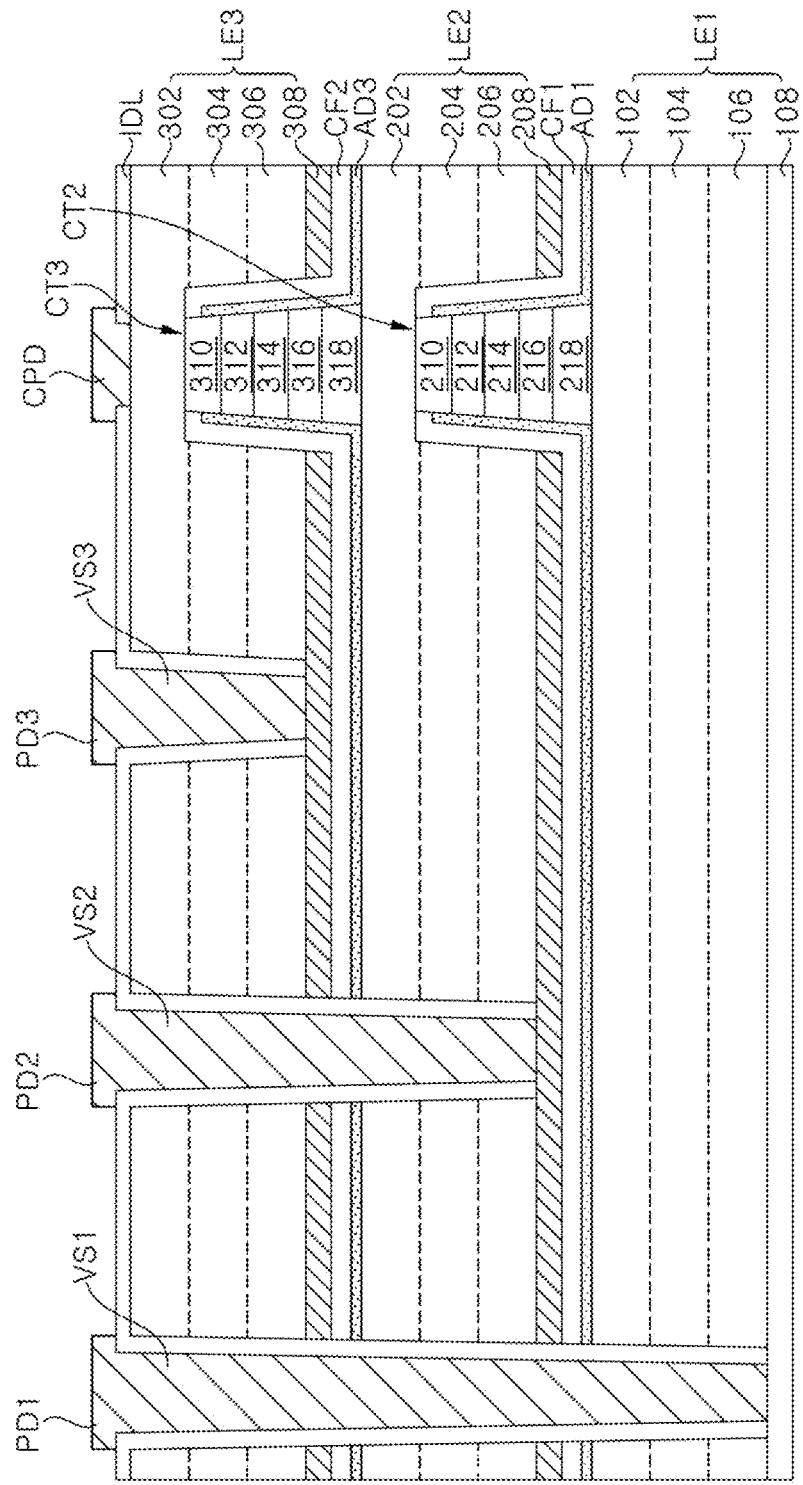
FIG. 4 is a cross-sectional view of a light emitting device according to yet still another exemplary embodiment.

FIG. 4 is a cross-sectional view of a light emitting device according to yet still another exemplary embodiment.

Referring to FIG. 4, a light emitting device may include a first light emitting part LE1, a second light emitting part LE2, and a third light emitting part LE3, which are stacked on a substrate 100.

The first light emitting part LE1 may include a first transparent electrode 108, a first p-type semiconductor layer 106, a first active layer 104, and a first n-type semiconductor layer 102, which are sequentially stacked, the second light emitting part LE2 may include a second transparent electrode 208, a second p-type semiconductor layer 206, a second active layer 204, and a second n-type semiconductor layer 202, which are sequentially stacked, and the third light emitting part LE3 may include a third transparent electrode 308, a third p-type semiconductor layer 306, a third active layer 304, and a third n-type semiconductor layer 302, which are sequentially stacked.

The light emitting device may further include a common pad CPD, which is electrically coupled with the first n-type semiconductor layer 102, the second n-type semiconductor layer 202, and the third n-type semiconductor layer 302, a first pad PD1 electrically coupled with the first p-type semiconductor layer 106, a second pad PD2 electrically coupled with the second p-type semiconductor layer 206, and a third pad PD3 w electrically coupled with the third p-type semiconductor layer 306.

The light emitting device may further include a second contact structure CT2, which extends through a portion of the second light emitting part LE2, and a third contact structure CT3, which extends through a portion of the third light emitting part LE3. One surface of the second contact structure CT2 may be brought into electrical contact with the first n-type semiconductor layer 102, and the other surface of the second contact structure CT2 facing away from the one surface may be brought into electrical contact with the second n-type semiconductor layer 202. One surface of the third contact structure CT3 may be brought into electrical contact with the second n-type semiconductor layer 202, and the other surface of the third contact structure CT3 facing away from the one surface may be brought into electrical contact with the third n-type semiconductor layer 302. The second n-type semiconductor layer 202 may be disposed between the second contact structure CT2 and the third contact structure CT3.

In a first contact structure CT1, the second contact structure CT2, and the third contact structure CT3, bonding layers, second conductive layers, barrier layers, first conductive layers, and ohmic layers may be sequentially stacked. Each of the first contact structure CT1, the second contact structure CT2, and the third contact structure CT3 may have a width that gradually increases in a downward direction.

The light emitting device may further include a first color filter CF1, which surrounds the outer sidewall of the second contact structure CT2 and extends onto the second transparent electrode 208, and a first adhesion layer AD1, which surrounds the outer sidewall of the first color filter CF1, extends onto the first color filter CF1, and bonds the first light emitting part LE1 and the second light emitting part LE2 to each other.

The light emitting device may further include a second color filter CF2, which surrounds the outer sidewall of the third contact structure CT3 and extends onto the third transparent electrode 308, and a second adhesion layer AD2, which surrounds the outer sidewall of the second color filter CF2, extends onto the second color filter CF2, and bonds the second light emitting part LE2 and the third light emitting part LE3 to each other.

In the illustrated exemplary embodiment, since the first light emitting part LE1, the second light emitting part LE2, the third light emitting part LE3, the first adhesion layer AD1, the second adhesion layer AD2, the third adhesion layer AD3, the first color filter CF1, the second color filter CF2, the insulation layer IDL, the common pad CPD, the first pad PD1, the second pad PD2, the third pad PD3, the first via structure VS1, the second via structure VS2, and the third via structure VS3 are substantially the same as those described above with reference to FIGS. 1A to 1C, 2A and 2B, repeated descriptions thereof will be omitted.

Hereafter, a method for manufacturing the light emitting device described above with reference to FIGS. 1A and 1B will be described in more detail.

FIGS. 5 to 17 are cross-sectional views illustrating a method for manufacturing a light emitting device according to an exemplary embodiment.

Figure 5:
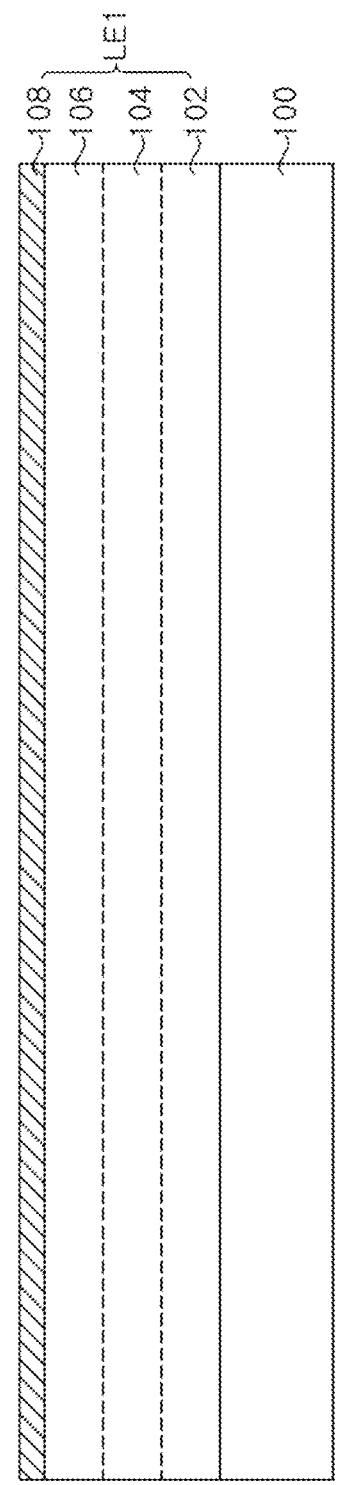
FIGS. 5, 6, 7, 8, 9, 10, 11, 12, 13, 14, 15, 16, and 17 are cross-sectional views illustrating a method for manufacturing a light emitting device according to an exemplary embodiment.

Referring to FIG. 5, a first n-type semiconductor layer 102, a first active layer 104, a first p-type semiconductor layer 106, and a first transparent electrode 108 may be formed on a first substrate 100, to form a first light emitting part LE1.

The first n-type semiconductor layer 102, the first active layer 104, and the first p-type semiconductor layer 106 may be sequentially grown on the substrate 100 through a process, such as metal organic chemical vapor deposition (MOCVD) or molecular beam epitaxy (MBE). Then, the first transparent electrode 108 may be formed on the first p-type semiconductor layer 106 by using a chemical vapor deposition (CVD) process, or a physical vapor deposition (PVD) process.

Figure 6:
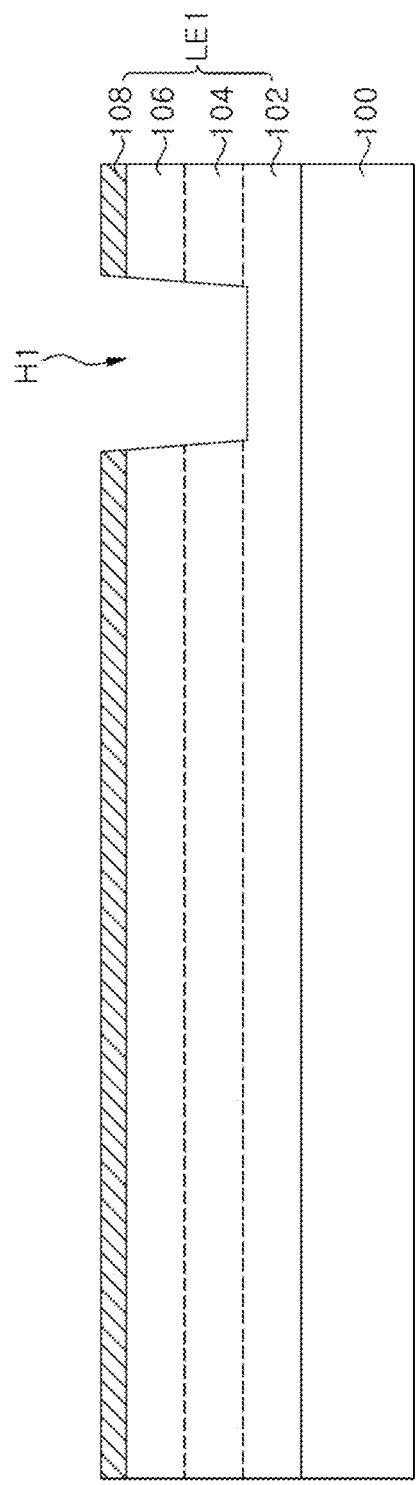

Referring to FIG. 6, by etching the first light emitting part LE1 to expose the first n-type semiconductor layer 102, a first contact hole H1 passing through the first transparent electrode 108, the first p-type semiconductor layer 106, and the first active layer 104 may be formed.

For example, the first light emitting part LE1 may have a substantially quadrangular structure when viewed from the top, and the first hole H1 may be disposed at a first corner CN1. The first hole H1 may have a width that gradually decreases in a downward direction. As such, the first active layer 104 may have a width less than the first p-type semiconductor layer 106, and the first p-type semiconductor layer 106 may have a width less than the first transparent electrode 108.

Figure 7:
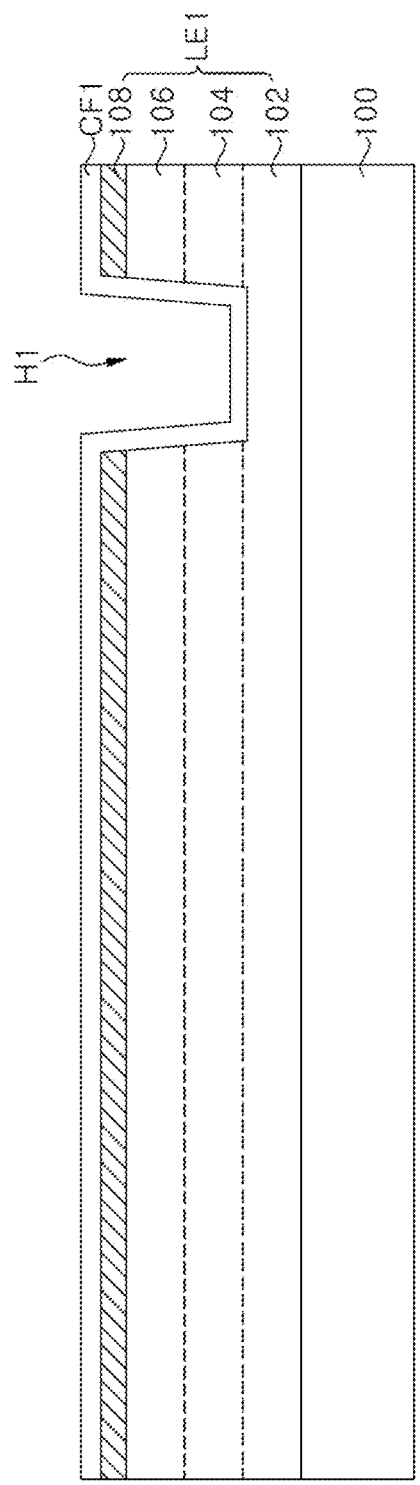

Referring to FIG. 7, a first color filter CF1 may be continuously formed along the surface of the first light emitting part LE1 so as not to fill the first hole H1. The first color filter CF1 may include a DBR having a structure, in which $TiO_2$ and $SiO_2$ are alternately stacked.

Figure 8:
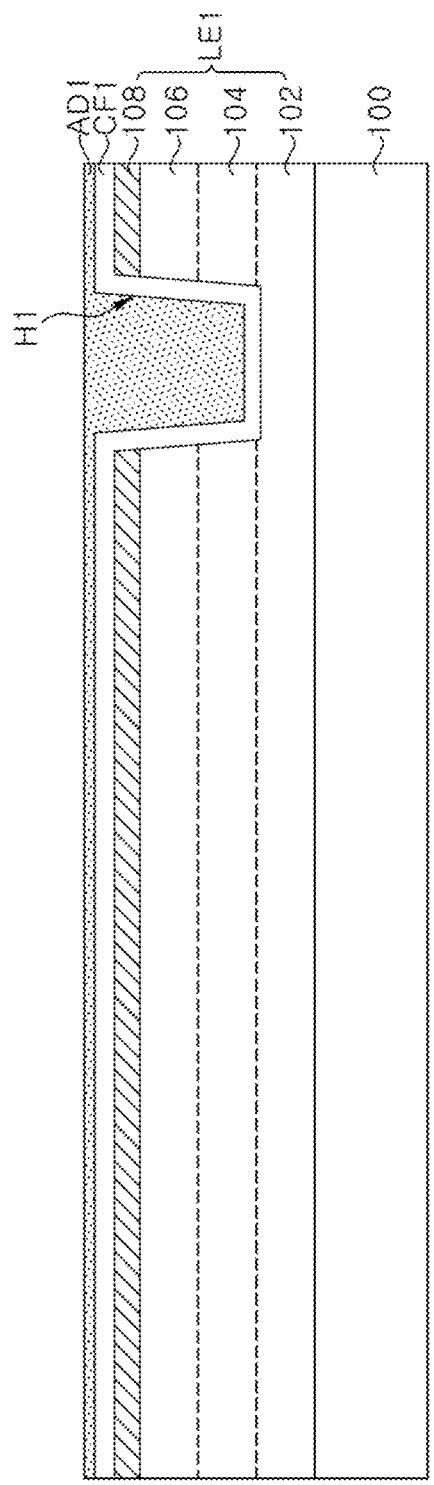

Referring to FIG. 8, a first adhesion layer AD1 may be formed on the first light emitting part LE1 formed with the first color filter CF1, so as to fill (or bury) the first hole H1. The first adhesion layer AD1 may include SOG.

Figure 9:
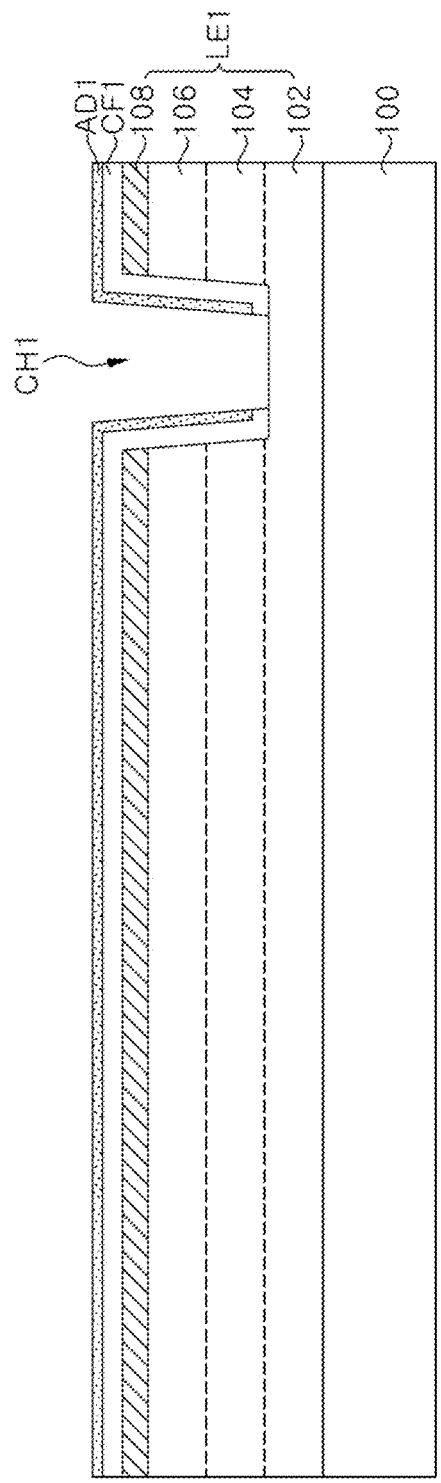

Referring to FIG. 9, by etching the first adhesion layer AD1 and the first color filter CF1 filling the first hole H1, a first contact hole CH1 exposing the first n-type semiconductor layer 102 may be formed. For example, the first contact hole CH1 may have a width that gradually decreases in the downward direction.

Figure 10:
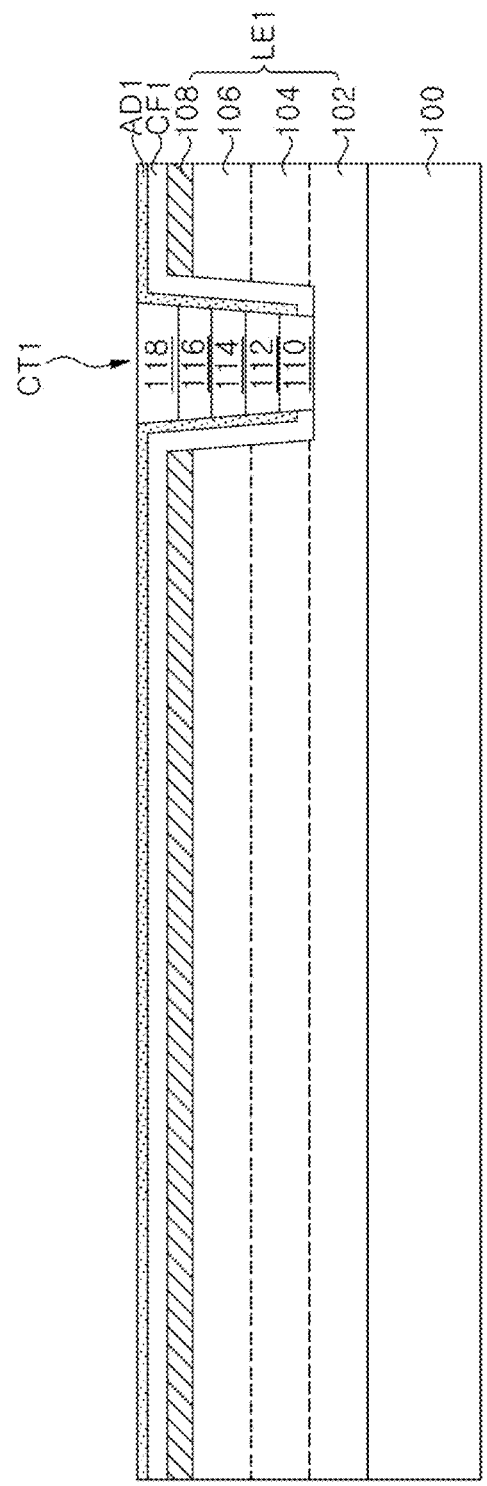

Referring to FIG. 10, a first contact structure CT1, which fills the inside of the first contact hole CH1 may be formed. As the first contact structure CT1, an ohmic layer 110, a first conductive layer 112, a barrier layer 114, a second conductive layer 116, and a bonding layer 118 may be sequentially stacked. The ohmic layer 110 may include Cr, the first conductive layer 112 may include Al, the barrier layer 114 may include Ti and Ni, which are stacked a plurality of times, the second conductive layer 116 may include Au, and the bonding layer 118 may include In or Sn.

Figure 11:
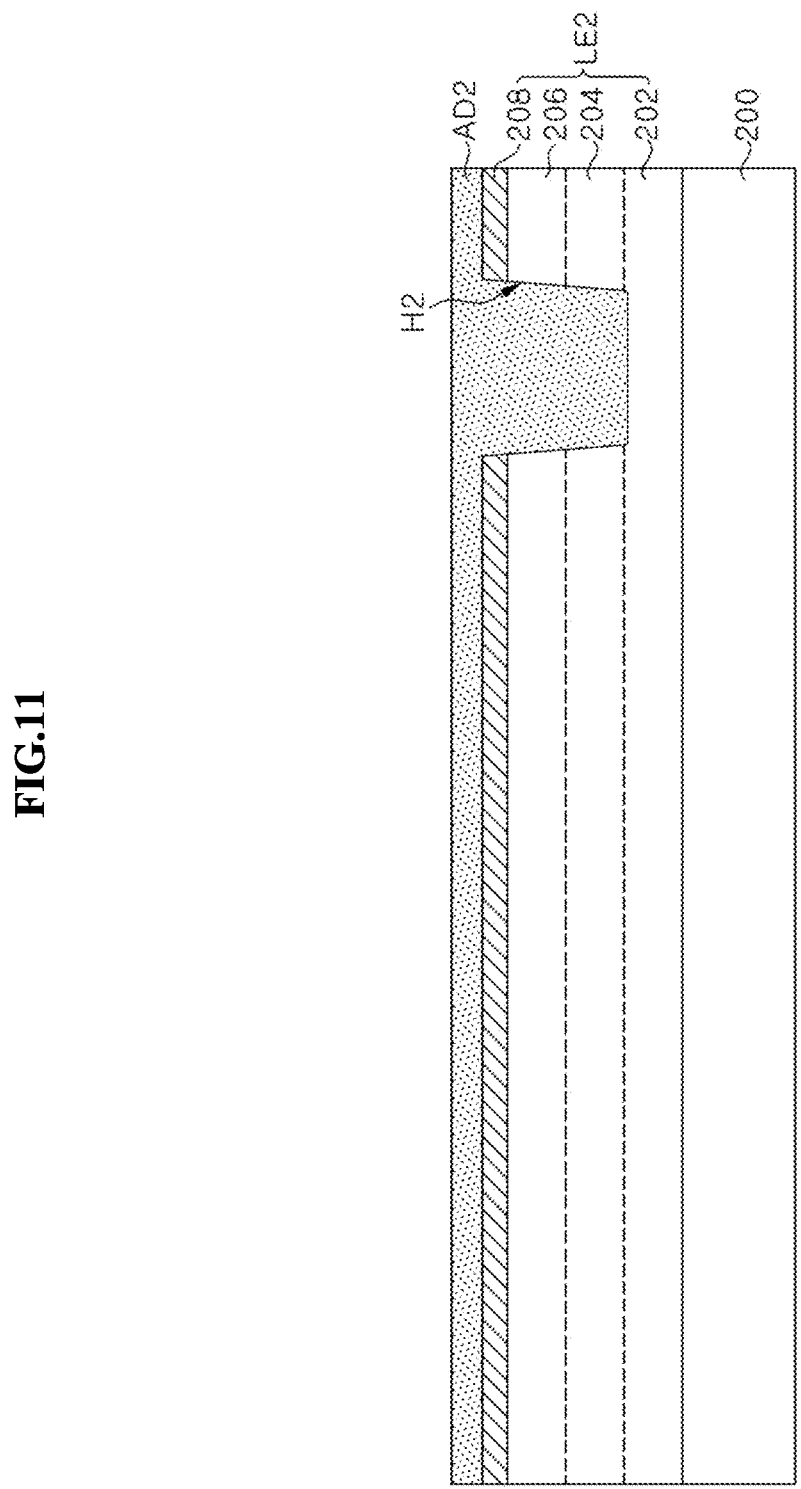

Referring to FIG. 11, a second light emitting part LE2 including a second n-type semiconductor layer 202, a second active layer 204, a second p-type semiconductor layer 206, and a second transparent electrode 208 may be formed on a second substrate 200. Then, a second hole H2, which exposes the second n-type semiconductor layer 202 may be formed, and a second adhesion layer AD2, which fills the inside of the second hole H2 may be formed.

Figure 12:
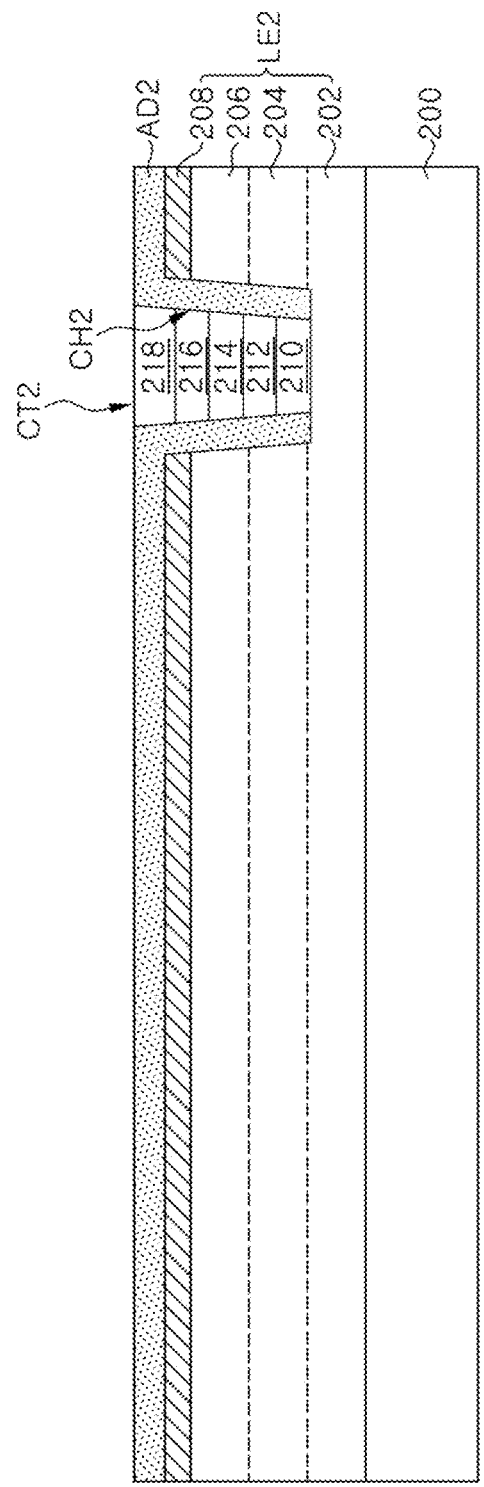

Referring to FIG. 12, after forming the second contact hole CH2 exposing the second n-type semiconductor layer 202, the second adhesion layer AD2 filling the second hole H2 may be etched to form a second contact structure CT2 to fill the second contact hole CH2. As the second contact structure CT2, an ohmic layer 210, a first conductive layer 212, a barrier layer 214, a second conductive layer 216, and a bonding layer 218 may be sequentially stacked.

Figure 13:
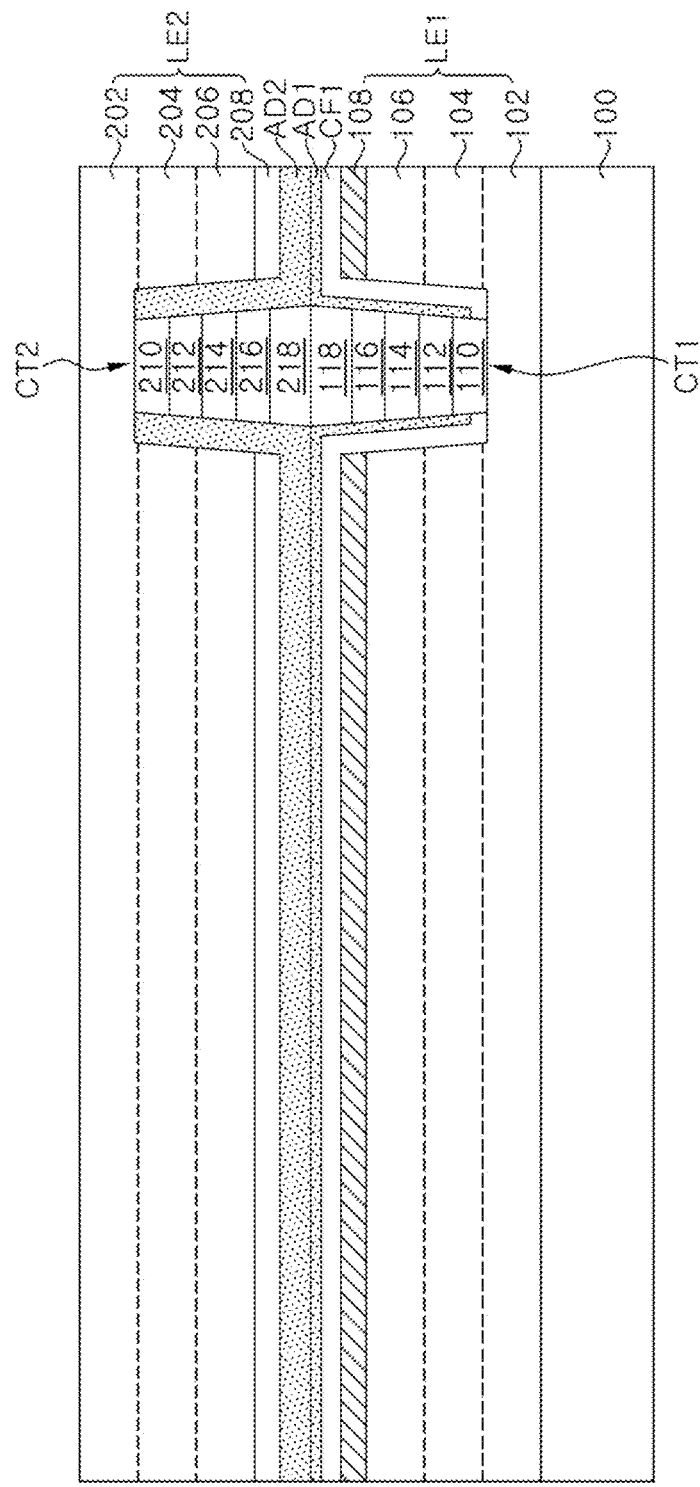

Referring to FIG. 13, the second light emitting part LE2 may be turned over and be bonded to the first light emitting part LE1, such that the bonding layer 218 of the second contact structure CT2 is boned with the bonding layer 118 of the first contact structure CT1.

Then, the second substrate 200 may be removed by a laser lift-off process, or the like.

Figure 14:
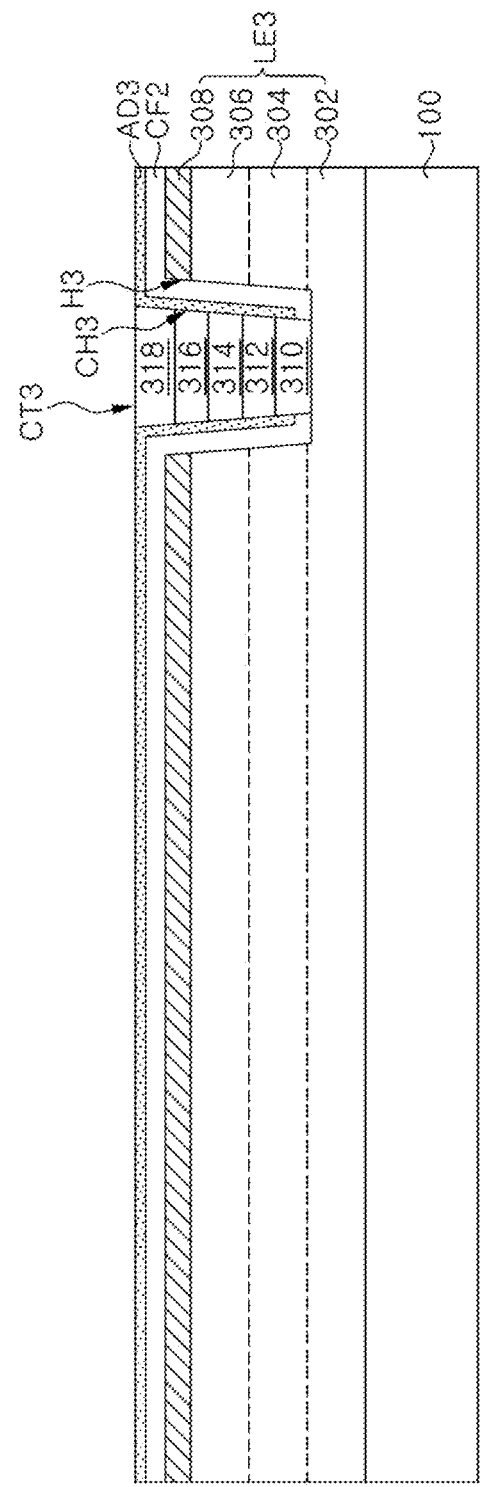

Referring to FIG. 14, a third light emitting part LE3 including a third n-type semiconductor layer 302, a third active layer 304, a third p-type semiconductor layer 306 and a third transparent electrode 308 may be formed on a third substrate 300. Then, a third hole H3, which exposes the third n-type semiconductor layer 302 may be formed, and a third adhesion layer AD3, which fills the inside of the third hole H3 may be formed.

After forming a third contact hole CH3 exposing the third n-type semiconductor layer 302, the third adhesion layer AD3 filling the third hole H3 may be etched. Then, a second color filter CF2 may be continuously formed along the surface of the third light emitting part LE3 so as not to fill the third contact hole CH3, and a third contact structure CT3 filling the third contact hole CH3 may be formed on the second color filter CF2. The second color filter CF2 may include a DBR having a structure, in which $TiO_2$ and $SiO_2$ are alternately stacked. The second color filter CF2 may be different from the first color filter CF1 in terms of the composition ratio and alternate stacking order and number of $TiO_2$ and $SiO_2$. As the third contact structure CT3, an ohmic layer 310, a first conductive layer 312, a barrier layer 314, a second conductive layer 316, and a bonding layer 318 may be sequentially stacked.

Figure 15:
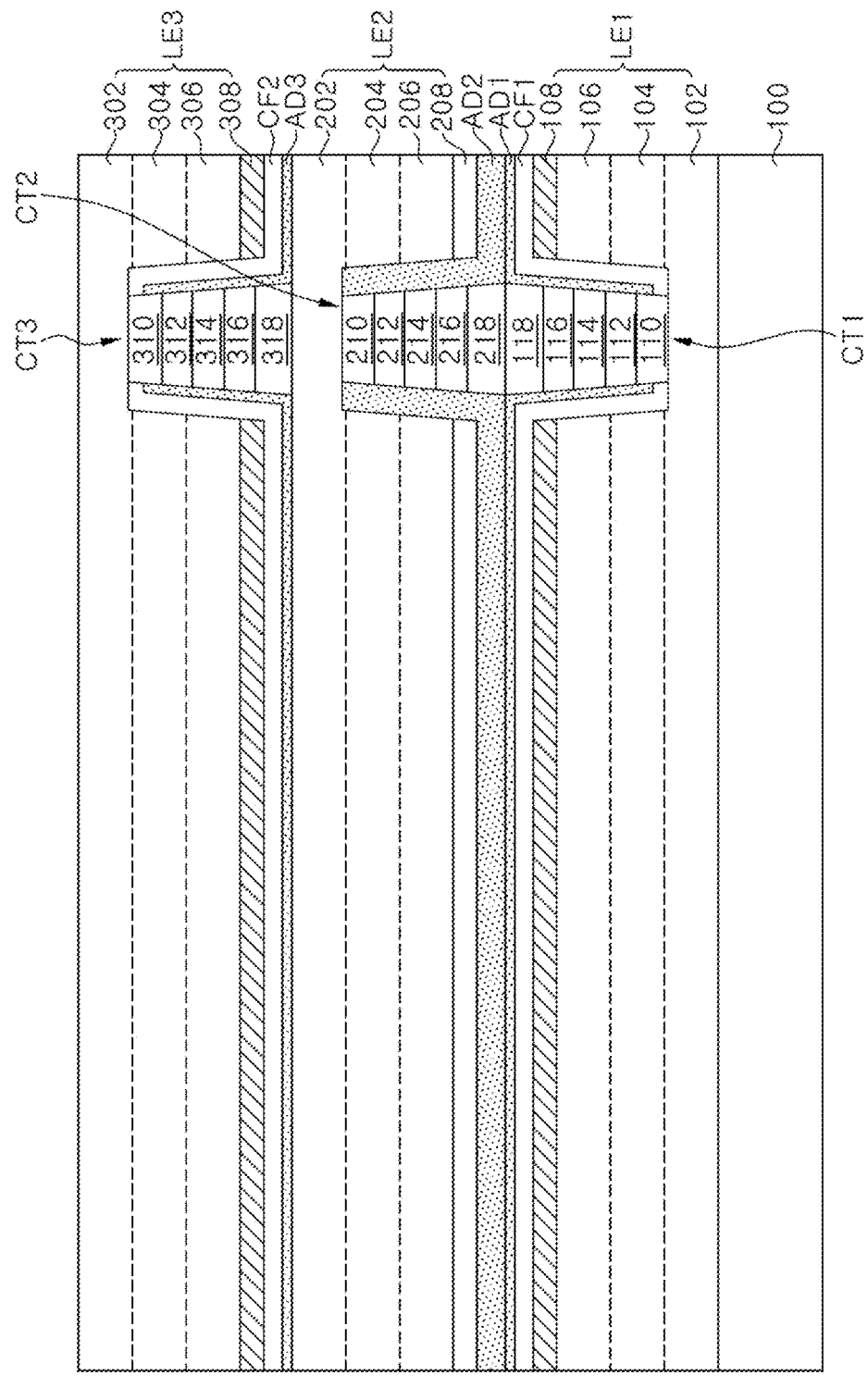

Referring to FIG. 15, the third light emitting part LE3 may be turned over and be bonded to the second light emitting part LE2, such that the bonding layer 318 of the third contact structure CT3 faces the second n-type semiconductor layer 202. As such, the second light emitting part LE2 bonded with the first light emitting part LE1 may be bonded with the third light emitting part LE3.

Then, the third substrate 300 may be removed by a laser lift-off process, or the like.

Figure 16:
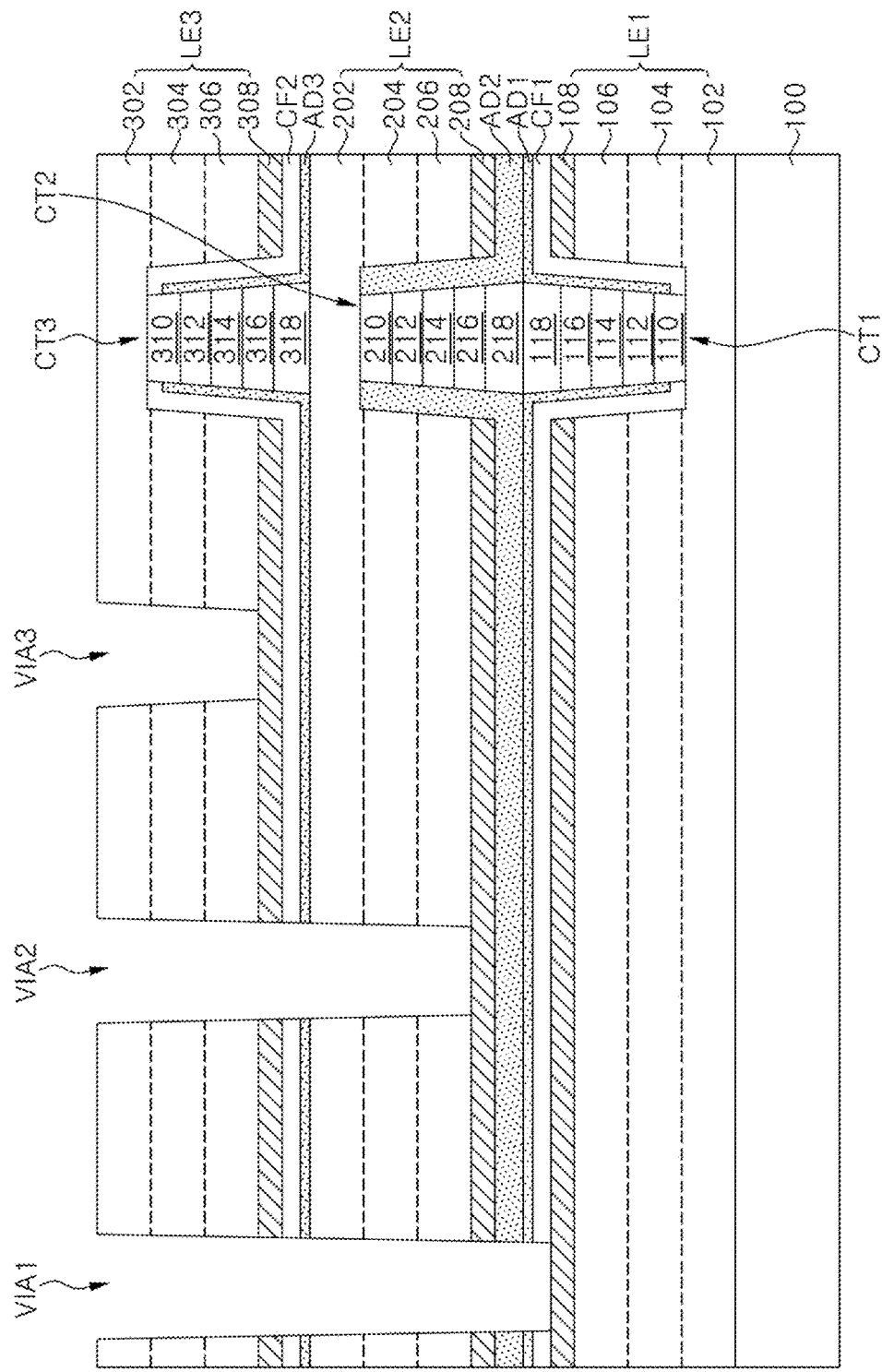

Referring to FIG. 16, a first via hole VIA1 exposing the first transparent electrode 108, a second via hole VIA2 exposing the second transparent electrode 208, and a third via hole VIA3 exposing the third transparent electrode 308 may be formed.

The first via hole VIA1 may pass through the third light emitting part LE3, the second color filter CF2, the third adhesion layer AD3, the second light emitting part LE2, the second adhesion layer AD2, the first adhesion layer AD1, and the first color filter CF1, and may expose the first transparent electrode 108.

The second via hole VIA2 may pass through the third light emitting part LE3, the second color filter CF2, the third adhesion layer AD3, the second n-type semiconductor layer 202, the second active layer 204, and the second p-type semiconductor layer 206, and may expose the second transparent electrode 208.

The third via hole VIA3 may pass through the third n-type semiconductor layer 302, the third active layer 304 and the third p-type semiconductor layer 306, and may expose the third transparent electrode 308.

According to an exemplary embodiment, each of the first light emitting part LE1, the second light emitting part LE2, and the third light emitting part LE3 may have a substantially quadrangular structure when viewed from the top. The second light emitting part LE2 may be turned over and be disposed on the first light emitting part LE1, and the third light emitting part LE3 may be turned over and be disposed on the second light emitting part LE2.

The first via hole VIA1 may be disposed at a second corner CN2, the second via hole VIA2 may be disposed at a third corner CN3, and the third via hole VIA3 may be disposed at a fourth corner CN4.

Figure 17:
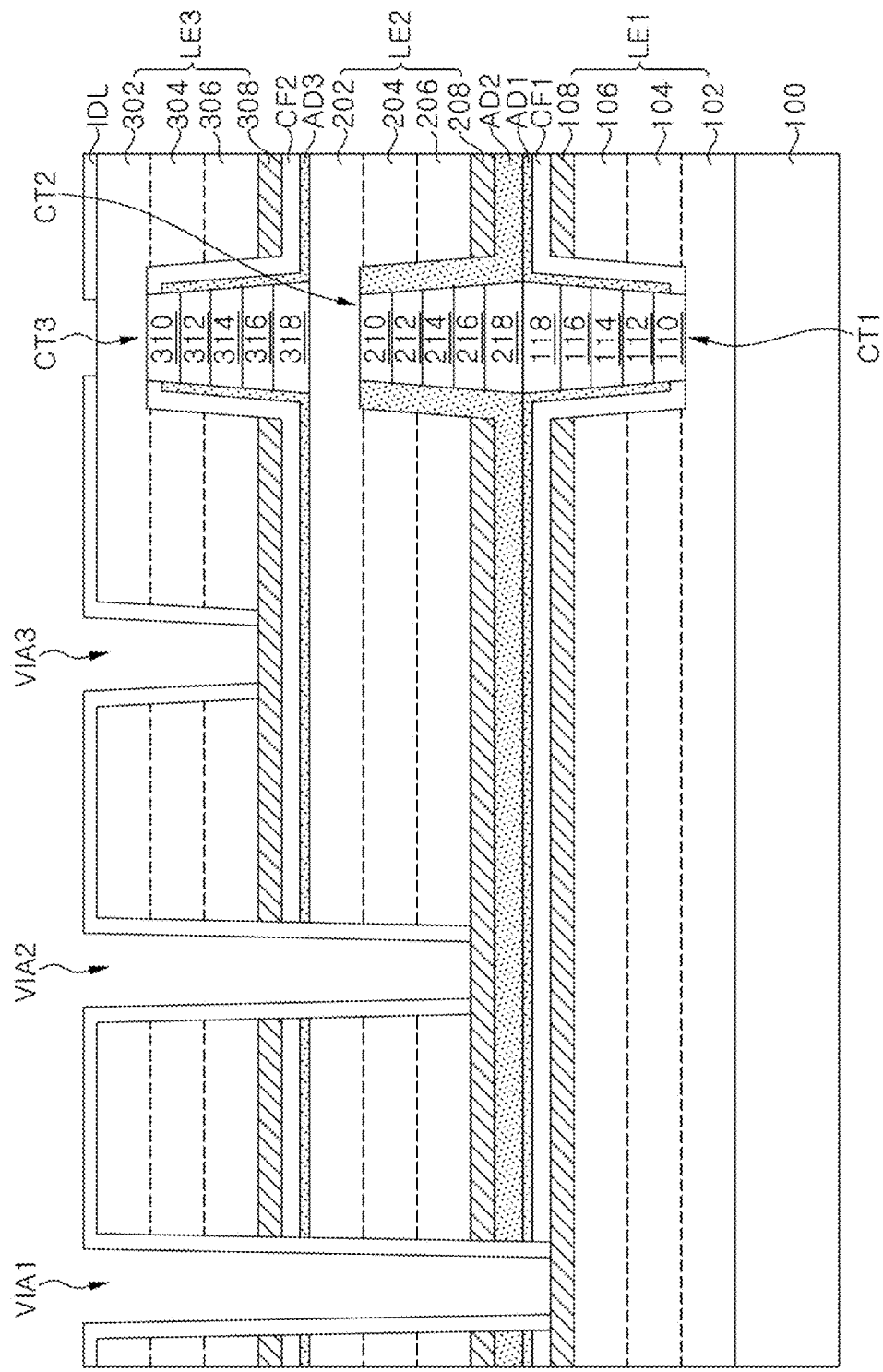

Referring to FIG. 17, an insulation layer IDL may be formed continuously along the surfaces of the third light emitting part LE3, the second color filter CF2, the third adhesion layer AD3, the second light emitting part LE2, the second adhesion layer AD2, the first color filter CF1, and the first adhesion layer AD1, so as not to fill the first via hole VIA1, the second via hole VIA2, and the third via hole VIA3. The insulation layer IDL may include a silicon oxide or a silicon nitride, for example.

Then, the insulation layer IDL may be etched, such that the first transparent electrode 108 may be exposed on the bottom of the first via hole VIA1, the second transparent electrode 208 may be exposed on the bottom of the second via hole VIA2, the third transparent electrode 308 may be exposed on the bottom of the third via hole VIA3, and a portion of the third n-type semiconductor layer 302 may be exposed.

Referring back to FIG. 1B, a first via structure VS1 filling the first via hole VIA1 and electrically contacting the first transparent electrode 108, a second via structure VS2 filling the second via hole VIA2 and electrically contacting the second transparent electrode 208, and a third via structure VS3 filling the third via hole VIA3 and electrically contacting the third transparent electrode 308 may be respectively formed.

The, a first pad PD1 electrically coupled to the first via structure VS1, a second pad PD2 electrically coupled to the second via structure VS2, a third pad PD3 electrically coupled to the third via structure VS3, and a common pad CPD electrically coupled with the third n-type semiconductor layer 302 may be additionally formed.

In some exemplary embodiments, the first pad PD1, the second pad PD2, and the third pad PD3 may be integrated with the first via structure VS1, the second via structure VS2 and the third via structure VS3, respectively.

According to exemplary embodiments, as a first n-type semiconductor layer, a second n-type semiconductor layer, and a third n-type semiconductor layer are electrically coupled in common to a common pad, current may be stably supplied thereto as compared to when a first p-type semiconductor layer, a second p-type semiconductor layer, and a third p-type semiconductor layer are coupled in common.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
a light emitter including a plurality of semiconductor layers and configured to emit light;
a first electrode electrically connected to one of the plurality of semiconductor layers;
a second electrode electrically connected to one of the plurality of semiconductor layers;
a first adhesion layer disposed on a side of the light emitter; and
a second adhesion layer disposed on an opposite side of the light emitter,
wherein:
the light emitter is disposed between the first adhesion layer and the second adhesion layer;
the second electrode includes a first electrode region and a second electrode region connected to each other;
the first adhesion layer surrounds a side surface of the first electrode region; and
a width of the first electrode decreases in a downward direction and a width of the second electrode increases in the downward direction in a cross sectional view.

2. The light emitting device of claim 1, wherein the light emitter further includes a substrate, a first pad, and a second pad,
wherein the substrate has a quadrangular shape in a plan view, and
wherein the first pad is disposed on a first corner of the substrate and the second pad is disposed on a second corner of the substrate.

3. The light emitting device of claim 2, wherein the light emitter includes a hole formed partially through the plurality of semiconductor layers.

4. The light emitting device of claim 3, wherein a width of the hole increases in the downward direction.

5. The light emitting device of claim 4, wherein the first adhesion layer is disposed on the hole.

6. The light emitting device of claim 1, wherein a bottom surface of the second electrode is disposed at a level lower than the plurality of semiconductor layers.

7. The light emitting device of claim 1, wherein the second adhesion layer is silicon oxide or silicon nitride.

8. A light emitting device comprising:
a light emitter including a plurality of semiconductor layers and configured to emit light;
a first electrode electrically connected to one of the plurality of semiconductor layers;
a second electrode electrically connected to one of the plurality of semiconductor layers;
a first transmittance layer disposed on a side of the light emitter; and
a second transmittance layer disposed on an opposite side of the light emitter,
wherein:
the second electrode includes a first electrode region and a second electrode region connected to each other;
the first transmittance layer covers a side surface of the first electrode region;
the second transmittance layer is closer to the first electrode region than the second electrode region; and
a width of the first electrode decreases in a downward direction and a width of the second electrode increases in the downward direction in a cross sectional view.

9. The light emitting device of claim 8, wherein the light emitter further includes a substrate, a first pad, and a second pad,
wherein the substrate has a quadrangular shape in a plan view, and
wherein the first pad is disposed on a first corner of the substrate and the second pad is disposed on a second corner of the substrate.

10. The light emitting device of claim 9, wherein the light emitter includes a hole formed partially through the plurality of semiconductor layers.

11. The light emitting device of claim 10, wherein a width of the hole increases in the downward direction.

12. The light emitting device of claim 11, wherein the first transmittance layer is disposed on the hole.

13. The light emitting device of claim 8, wherein a bottom surface of the second electrode is disposed at a level lower than the plurality of semiconductor layers.

14. The light emitting device of claim 8, wherein the second transmittance layer is silicon oxide or silicon nitride.

15. A light emitting device comprising:
a light emitter including a plurality of semiconductor layers and configured to emit light;
a first electrode electrically connected to one of the plurality of semiconductor layers;
a second electrode electrically connected to one of the plurality of semiconductor layers;
a first layer disposed on a side of the light emitter; and
a second layer disposed on an opposite side of the light emitter,
wherein:
the second electrode includes a first electrode region and a second electrode region electrically connected to each other;
the first layer covers a side surface of the first electrode region;
the second layer is closer to the first electrode region than the second electrode region; and
a width of the first electrode decreases in a downward direction and a width of the second electrode increases in the downward direction in a cross sectional view.

16. The light emitting device of claim 15, wherein the light emitter further includes a substrate, a first pad, and a second pad, wherein the substrate has a quadrangular shape in a plan view, and wherein the first pad is disposed on a first corner of the substrate and the second pad is disposed on a second corner of the substrate.

17. The light emitting device of claim 16, wherein the light emitter includes a hole formed partially through the plurality of semiconductor layers.

18. The light emitting device of claim 17, wherein a width of the hole increases in the downward direction.

19. The light emitting device of claim 17, wherein the first layer is disposed on the hole.

20. The light emitting device of claim 15, wherein a bottom surface of the second electrode is disposed at a level lower than the plurality of semiconductor layers.

* * * * *